(12) United States Patent
Kelly

(10) Patent No.: US 9,325,193 B2
(45) Date of Patent: Apr. 26, 2016

(54) APPARATUS AND METHOD FOR ACCURATE ENERGY DEVICE STATE-OF-CHARGE (SOC) MONITORING AND CONTROL USING REAL-TIME STATE-OF-HEALTH (SOH) DATA

(71) Applicant: Shawn P. Kelly, Westfield, MA (US)

(72) Inventor: Shawn P. Kelly, Westfield, MA (US)

(*) Notice: Subject to any disclaimer, the term of this patent is extended or adjusted under 35 U.S.C. 154(b) by 36 days.

(21) Appl. No.: 14/485,865

(22) Filed: Sep. 15, 2014

(65) Prior Publication Data

US 2015/0002105 A1 Jan. 1, 2015

Related U.S. Application Data

(63) Continuation-in-part of application No. 14/236,944, filed as application No. PCT/US2012/050832 on Aug. 15, 2012, now Pat. No. 8,838,401.

(60) Provisional application No. 61/523,713, filed on Aug. 15, 2011.

(51) Int. Cl.
*G06F 19/00* (2011.01)
*H02J 7/00* (2006.01)
*G01R 31/36* (2006.01)

(52) U.S. Cl.
CPC ............. *H02J 7/007* (2013.01); *G01R 31/3679* (2013.01); *G01R 31/3662* (2013.01)

(58) Field of Classification Search
CPC ................... A61B 2560/0412; A61B 5/14532; Y02W 10/37

USPC .............................. 702/63–67, 182–185, 188
See application file for complete search history.

(56) References Cited

U.S. PATENT DOCUMENTS

| 6,642,719 B1 | 11/2003 | Seto |
| 8,838,401 B2 | 9/2014 | Kelly |

(Continued)

FOREIGN PATENT DOCUMENTS

| JP | 04-198783 A | 7/1992 |
| JP | 2639219 B2 | 8/1997 |

(Continued)

*Primary Examiner* — Edward Raymond
(74) *Attorney, Agent, or Firm* — Jay R. Yablon

(57) ABSTRACT

A device and associated testing method for empirically determining the state-of-charge of an electrochemical energy device, comprising: applying electrical excitations to the energy device at a predetermined electrical excitation frequency $\omega_e$; applying mechanical excitations to the energy device at a predetermined mechanical excitation frequency $\omega_m$; measuring an electrically-induced phase difference $\Delta\theta_e(\omega_e)$ between voltage (V) and current (I) within the energy device from applying the electrical excitations; measuring a mechanically-induced phase difference $\Delta\theta_e(\omega_m)$ between voltage (V) and current (I) within the energy device from applying the mechanical excitations; and deducing the empirical real-time state-of-health of the energy device by comparing the electrically-induced phase difference $\Delta\theta_e(\omega_e)$ with the mechanically-induced phase difference $\Delta\theta_e(\omega_m)$; and using the deduced state of health to determine the state of charge.

20 Claims, 6 Drawing Sheets

(56) References Cited

U.S. PATENT DOCUMENTS

| | | |
|---|---|---|
| 2004/0039297 A1 | 2/2004 | Abreu |
| 2007/0090843 A1* | 4/2007 | De Doncker et al. ......... 324/426 |
| 2009/0128097 A1 | 5/2009 | Esnard |
| 2011/0077880 A1 | 3/2011 | Gering |
| 2014/0188415 A1 | 7/2014 | Kelly |

FOREIGN PATENT DOCUMENTS

| | | |
|---|---|---|
| KR | 10-2006-0085303 A | 7/2006 |
| KR | 10-2010-0063343 A | 6/2010 |
| WO | 2013/025738 A2 | 2/2013 |
| WO | 2013/025738 A3 | 2/2013 |

* cited by examiner

APPARATUS AND METHOD FOR ACCURATE ENERGY DEVICE STATE-OF-CHARGE (SOC) MONITORING AND CONTROL USING REAL-TIME STATE-OF-HEALTH (SOH) DATA

CROSS-REFERENCE TO RELATED APPLICATIONS

This application is a continuation-in-part of application U.S. Ser. No. 14/236,944 filed Feb. 4, 2014, now U.S. Pat. No. 8,838,401 issued Sep. 16, 2014. Said Ser. No. 14/236,944 is in turn a US national stage application of PCT/US12/50832 filed Aug. 15, 2012, now expired. Said PCT/US12/50832 in turn claims benefit of provisional application U.S. 61/523,713 filed Aug. 15, 2011, now expired.

BACKGROUND OF THE INVENTION

Electrochemical impedance spectroscopy (EIS) has been used in studies of electrode and plate behavior during charging and discharging for years. The impedance response of the battery, or more broadly, any electrochemical energy storage and/or conversion device (including certain types of fuel cell technologies, solar cells, and even certain types of capacitor technologies), depends on the measurement frequency and the "state" of the energy device at the time it is tested. For the specific case of a battery, this method has been reported to be affected, to varying degrees, by many fundamental battery parameters, including battery design, manufacturing tolerances, aging, temperature, and state-of-charge (SoC). The goal of EIS State-of-Health (SoH) monitoring techniques is to extract as much information as possible about the electrochemical health of the battery. Based on the variability introduced by the parameters noted above this monitoring technique has fallen short in the market place. The evolution of the technology followed a very predictable path and this application discloses the next generation of this technology which is a revolutionary break-through in the science of EIS SoH battery monitoring.

This disclosure will elucidate the novelty, inventive step and industrial viability of a method and device for more accurately measuring the SoH of an energy device by illustrating the drawbacks of the current SoH measurement and prediction techniques on lead acid battery chemistry and showing how using ultrasonic energy as part of the measurement process overcomes these deficiencies. However, it should be understood that the disclosures here can be applied to any electrochemical energy storage and/or energy conversion devices (generally referred to simple as "energy devices"), including but not limited to, certain types of fuel cells, solar cells and capacitor technologies. In the broad understanding of the method and device disclosed here, it applies to any electrochemical energy device in which there are ionic species kinetic limitations and/or deficiencies. Certain fuel cells, solar cells and capacitors also have known ionic kinetic deficiencies which impact their operating characteristics and performance and it should be understood that this method and device disclosed encompasses these type of devices as well.

A brief background is necessary in order to elucidate the novelty of the invention being presented.

In recent years there has been considerable activity and debate regarding the use of internal "impedance" characteristics as a battery condition measurement. The interest reflects the desire for simple electronic means to replace discharge testing as a practical determination of residual battery capacity (i.e. both SoC and cycle life), particularly given the increased usage of valve-regulated lead-acid (VRLA) batteries (for the lead acid chemistry example). The advanced electronic monitoring technique disclosed here, in combination with the internal impedance degradation control methodology disclosed in U.S. Pat. No. 7,592,094, provide some powerful tools for battery monitoring and management systems. Utilization and effective integration of these mechanical excitation techniques separately or in combination will result in a technology platform making possible unprecedented improvements in the utilization of energy storage devices (i.e. the battery—Li-ion, Lead Acid, NiMh, Ni-based, Zn-based, etc.) while also dramatically improving the system's overall performance, lifetime and safety. In general, the currently available battery State-of-Charge (SoC) monitoring and charge control systems do not adequately utilize energy storage systems to their fullest potential mostly based on an inability to empirically measure and thereby compensate for the negative effects of a battery's internal impedance build-up over service life (i.e. degradation). In fact, much of today's art practices in this field intensify the decline in battery performance and accelerate its failure rate by not taking into account and addressing the inherent inefficiencies and physiochemical differences brought on by the increasing battery internal impedance over service life. Furthermore, as battery-based systems become more and more demanding (i.e. more frequent charge and discharge, faster and more rapid transients, larger amplitudes, etc.), for applications, such as hybrid electric vehicles (HeV), hybrid electric vehicles (PHeV), electric vehicles (EV), grid scale frequency and voltage regulation, smarter smart phones, etc., this negative effect and trend on battery performance and service life will worsen.

As an example of how a build-up of a battery's internal impedance impacts its performance is shown in FIG. 7. FIG. 7 is data collected from performing cycle life testing of a commercial off-the-shelf Lead Acid (LA) battery. The plots shown are from the second of two 4000 minute lifetime cycle tests where the Open-Circuit Voltage (OCV) (after 20 seconds rest time) was measured until the charging cell reached 2.04V and then switched to discharge. Once the Closed-Circuit Voltage (CCV) discharge voltage reached 1.7V the next charge sequence would commence, effectively cycling the cells between 1.7V and 2.04V. The mechanical excitation delivery device/system was at a 100% duty cycle during charge and discharge and operated at 3.26 Mhz.

In FIG. 7, as the battery ages (i.e. declines in health as cycle life increases) the measured charge CCV (i.e. $V_{Battery}$) continues to rise and it takes longer and longer for its OCV (after 20 second rest period) to reach a threshold of 2.04V. This rise in CCV is caused by a steady but degrading build-up of the battery's internal impedance. It is also shown that as the battery ages the difference between the initial CCV at the end of the first few charges and that of the highest CCV taken at the end of the final charge is much greater for the non-vibrating cell with no mechanical excitation applied, than for the vibrating cell. This is a clear indicator that the mechanical excitation substantially minimizes the rate (i.e. the slope of CCV vs. cycle time) at which this degrading internal impedance ($Z_{Int}$) builds up. It is worthy to note that at around 3600 minutes (really, 7600 minutes because this is second 4000 minute test) into the cycle testing the non-vibrating cell commenced a charge and would not switch over to discharge. This was the final cycle of the non-vibrating cell whereby it failed to accept charge energy, i.e. this signifies a battery failure which is the end of the battery life. The test for the cell with mechanical excitation (vibration) lasted many more cycles.

As another example, FIG. 8 is a Cyclic-Voltammetry (CV) test which compares the Current (I) vs. Voltage (V) response of a 1 cm² area of porous lead (Pb) electrode submerged in sulfuric acid at a 1.31 specific gravity at 80° F. with and without mechanical excitation applied and at the same scan rate. The mechanical excitation delivery device/system was at a 100% duty cycle during charge and discharge scans and operated at 6.5 MHz. The current vs. voltage profile for the non-vibrating (i.e. control cell) and vibrating (i.e. test cell) are shown with legends in the figure. The area under the vibrating cell's discharge curve (which peaks at around 1.05V) is about 75% greater than the corresponding area under the non-vibrating cell's discharge curve (which peaks at around 1.13V). The area under these curves represent both charge (area under upper curves, positive region) and discharge (area under lower curves, negative region) power (i.e. Power=V*I), and therefore, can be directly correlated to charge energy in and discharge energy out (i.e. A-hr capacity—run time) based on using the same scan rate. The charge energy in to the control cell was larger than the charge energy in to the test cell, and the discharge energy out of the test cell was larger than the control cell. Therefore, the test cells electrochemical conversion efficiency was much higher than that of the control cells, on the order of 2×. Thus, the addition of high frequency mechanical excitation to this Pb-acid electrode system completely altered its electrical response characteristics. Given this, batteries with the proper mechanical excitation applied will behave much differently from what the industry is accustomed to and it will be important for battery manufacturers, integrators and users not to rely on the electrical response characteristics that are typically associated with the battery chemistry make-up alone. It should be noted that there are also other physiochemical benefits demonstrated and shown from this CV testing which provides further objective evidence that the test (i.e. vibrating) cell's internal impedance was significantly reduced.

It is widely accepted that the only way to truly know the true health of a battery is to periodically conduct test discharges. Once the test discharge is complete, and passes, this is a 'good' indicator that the battery is operating as designed and it provides peace-of-mind that the battery will perform its intended function when called upon. Unfortunately, conducting a test discharge is costly and time consuming. More importantly, if a test discharge is run on a battery pack too often it will ultimately reduce the battery's operating life, and the subsequent replacement will prove to be extremely costly. Batteries do not respond well to being fully discharged and it directly takes away from the battery life.

When conducting a test discharge it is often necessary to take the battery off-line, i.e. disconnect from its intended function, and therefore alternative measures for back-up power need to be in place. Typically, a back-up battery pack, or other means of power, such as diesel generator, fuel-cell, etc., is added to the system design to minimize the impact of this necessary operational restriction, however, this brute force attempt adds significant up front capital and maintenance cost to the project. The industry is in need of an on-line electronic measurement technique that will supply the user accurate SoH information in real-time based on empirical data acquired from a battery itself. If one does not use real-time empirical SoH date, or uses prediction algorithms or look-up tables such as are often supplied by battery or device manufacturer or even worse yet, if it is not accounted for at all, then the systems which monitor, control and manage the energy storage systems performance, lifetime and safety are compromised. Simply put: there is no substitute for real-time empirical state of health data obtained from the battery itself, as the basis for knowing the actual state of charge, and thereby being able to accurately report data to the user as well as monitor and control and optimize the battery. The length of a test discharge for a primary battery back-up plant is dependent on the rate at which it is discharged. Typically, this time is determined by how much of a load is on the system and how long it may be needed in an emergency situation. As a point of reference, some applications require the battery pack to support critical loads for a period up to ~72 Hours. Therefore, the minimum time the battery pack will be off-line is approximately 3 days, while the battery is being discharged. However, after the 3-day test discharge is complete the battery is still not available for its intended function. The battery must be charged back up and this is also a time consuming process. If the battery is charged too hard or too fast it will take away from the battery's operating life, and again the replacement costs are significant. Thus, a general rule is that the battery should be charged for at least the length of time it was discharged, however, battery manufacturers would prefer a much longer charge time (on the order of 30 days for very large lead-acid battery packs). Therefore, the minimum time the critical battery back-up source in this example will be off-line, excluding set-up and testing time, is approximately 6 days. However, this aggressive charging algorithm is on the edge of what battery manufacturers are willing to warrantee, so prudent engineering judgment would dictate using longer charge times, thus increasing the down time of a critical energy source.

A purpose of this novel, inventive and industrious mechanical excitation technique is to remove this inherent uncertainty in the electronic measurement technique, thereby obviating the need to conduct frequent and costly test discharges. Conducting periodic test discharges of the plants critical battery back-up not only places sever operational restrictions on the plant, but, even more importantly it reduces the operating life of the battery pack and results in premature battery pack replacement. If the utility tries to minimize the length of time that this necessary operational restriction is in place, by charging the battery at a faster than recommended rate, than this will ultimately result in unwanted and premature costly battery pack replacement. Thus, the peace of mind that comes with knowing that your critical battery back-up source is ready for its intended function comes at a great cost. The utility has to weigh the risk of minimizing operational restrictions against the looming cost of replacing its battery pack. As a result, many companies are attempting to determine the battery health without test discharging. The method disclosed herein will offer a piece of mind to the plant owners that there battery pack will perform its intended function without the need to perform costly, restrictive and timely test discharges.

SUMMARY OF THE INVENTION

A device and associated testing method for empirically determining the state-of-charge of an electrochemical energy device, comprising: applying electrical excitations to the energy device at a predetermined electrical excitation frequency $\omega_e$; applying mechanical excitations to the energy device at a predetermined mechanical excitation frequency $\omega_e$; measuring an electrically-induced phase difference $\Delta\theta_e(\omega_e)$ between voltage (V) and current (I) within the energy device from applying the electrical excitations; measuring a mechanically-induced phase difference $\Delta\theta_e(\omega_m)$ between voltage (V) and current (I) within the energy device from applying the mechanical excitations; and deducing the empirical real-time state-of-health of the energy device by comparing the electrically-induced phase difference $\Delta\theta_e(\omega_e)$ with the mechanically-induced phase difference $\Delta\theta_e(\omega_m)$; and using the deduced state of health to determine the state of charge.

This same method can be used to provide accurate run-time (i.e. SoC, the 'Fuel Gauge') and electrical performance (better monitoring and charge control and optimization) information and life time predictions (i.e. cycle life at current usage profile) for the energy device. In one embodiment of the invention, one applies this testing method and determines a baseline phase difference between current and voltage. Then, at a later time, when it is desired to test the health of the energy device, one again applies this testing method and compares the later phase difference with the baseline phase difference. The later phase difference diminishing from the baseline phase difference indicates energy device aging, and a decline in the energy device's electrochemical health, roughly linearly with the diminution. Using various prediction algorithms' and prediction techniques this method and device can be used to accurately predict the energy devices residual energy capacity (i.e. SoC) available for use as well as the device's remaining life time (i.e. cycle life at current usage profile).

Thus, having the ability to accurately measure a battery's internal impedance, without it being altered by the items mentioned above, while on-line and in real-time, will give battery manufacturers, system integrators and the end users the ability to account for this natural battery degradation mechanism, and will result in much more accurate SoC calculations, charge (including formation) control, cycle life calculations, battery and battery system optimization, and in general a much better performing and more reliable battery management system. Performance, lifetime and safety issues currently plaguing the industry stemming from suboptimal monitoring, control and management are significantly minimized and/or eliminated.

Typically the reported SoC is based on a relatively simple translation of the battery's CCV (i.e. $V_{Battery}$). There are other methods in the art which attempt to account for temperature and impedance effects and some are rather expensive and complex because they employ higher capacity processors and develop sophisticated algorithms based on computer models of the battery in question. Some even utilize battery or system designer look-up tables to forecast the effects of the temperature and internal impedance. In general, as the battery-operated devices get smaller and smaller (where "real estate" i.e. available space is a concern) while their capabilities are increased (i.e. more Apps and features), battery manufacturers and system integrators are compelled to settle for the lowest cost and least accurate CCV translation method. It is an important teaching of this disclosure that measuring CCV and using this input to ascertain the SoC of the battery without taking into account a battery's own empirically-deduced real-time SoH (i.e. its age, SoH or build up/internal impedance) results in inaccurate measures of the remaining capacity (i.e. SoC) and/or remaining runtime (i.e. cycle or service life) of the battery. This means that the data provided to the user about the battery will be inaccurate, and to the degree that the battery control is based on this data, that the control system will be suboptimal if not counterproductive. Similarly, the prominently-used Li-ion battery charging circuit for portable electronics employs a low-cost linear charger Integrated Circuit (IC) to charge the battery and uses the CCV (i.e. $V_{Battery}$) as its measured input. So if the battery's ever-increasing internal impedance is not properly compensated for, this will ultimately lead to capacity fade and accelerated degradation.

To illustrate why the battery CCV is not the optimal input if not compensated by the real-time empirical SoH of the battery a small charge/discharge system is depicted in FIG. 9. This simple electrical circuit depicts an ideal energy source ($V_o$) (i.e. in this case available chemical potential energy), its internal impedance ($Z_{Int}$) which grows as degrading deposits accumulate and the battery ages, the total voltage across the battery ($V_{Battery}$) as measured at its terminals (CCV or OCV), a Charger, a Load, a switch (SW1) and the Current (I). The circuit in FIG. 9 is shown in its charge condition and the current (I) is traveling to the left through $Z_{Int}$ and into Vo in order to recharge the battery from a depleted condition (i.e. low SoC). $V_{Battery}$ if measured with either charge or discharge current (I) present is the measured CCV, and without current (I) present is the measured OCV. In this Figure $V_{Int}$ terminals are available to measure the voltage dropped across the battery's internal impedance $Z_{Int}$. An arrow is also shown across $Z_{Int}$ to represent its variability and to aid in visualizing an ever-increasing $V_{Int}$ as the battery's $Z_{Int}$ increases over service life. Thus, it can be shown that if a battery is charged at the beginning of service life (i.e. a brand new battery) that it has one value of $Z_{Int}$, and if this same charge current (I) is applied later in the battery's service life, then voltage drop across the battery's internal impedance ($V_{Int}$) will be greater and greater as the battery ages.

Because $Vo+V_{Int}=V_{Battery}$ it should be clear to one skilled in the art that if $V_{Int}$ increases at the same current (I), then less potential will be available across Vo to recharge the battery. So, initially in service life when the internal impedance ($Z_{Int}$) is relatively low, the energy lost (i.e. wasted in form of heat) will impact the potential to charge the battery Vo much less than at other times after the battery has been in service. Therefore, the measured CCV (or $V_{Battery}$) upon which many systems base their monitoring and charge control algorithms is comprised of two voltage components and one of these is dependent on $Z_{Int}$ which increases over the service life of the battery. If this is not taken into account, by not applying the empirical SoH correction factor compensation in some form, the overall energy storage management program will be adversely affected. In other words, if one does not understand and compensate for how $V_{Int}$ and Vo re-proportion over the service life due to increasing internal impedance ($Z_{Int}$) then systems that depend on the measured CCV (i.e. $V_{Battery}$) may start out at their designed or rated X +/−% accuracy, however, that will be short-lived and the system will see a steady decline in accuracy. Restated yet again, if one does not understand and compensate for how $V_{Int}$ and Vo re-proportion over the service life due to increasing internal impedance ($Z_{Int}$) then systems that depend on the measured CCV (i.e. $V_{Battery}$) may start out at their designed or rated X +/−% accuracy, however, that will be short-lived and the system will see a steady decline in accuracy. To the extent that the battery is monitored or controlled based on this CCV data, that monitoring and control will be sub-optimal, and the battery's performance will be worse and its lifetime shorter it could otherwise be.

BRIEF DESCRIPTION OF THE DRAWINGS

The features of the invention believed to be novel are set forth in the appended claims. The invention, however, together with further objects and advantages thereof, may best be understood by reference to the following description taken in conjunction with the accompanying drawing(s) summarized below.

DETAILED DESCRIPTION

This disclosure will elucidate the novelty, inventive step and industrial viability of this method and device by illustrating the drawbacks of current SoH measurement techniques on lead acid battery chemistry, however, it should be understood that this technique can be applied to any electrochemical energy storage and/or conversion device; including, certain types of fuel cells, solar cells and capacitors (i.e. hybrid and super capacitor technologies).

In general, many of the inherent limitations of typical electrochemical energy storage and/or conversion devices are the result of ionic kinetic deficiencies, i.e. low diffusion and migration rates of the chemical reaction product ions (i.e., ionic species). In fact, these same kinetic deficiencies are the main differentiator between the performance of an ideal capacitor and an electrochemical energy storage device (e.g., battery). Certain types of fuel cells, such as: Polymer Electrolyte Membrane (PEM) also have ionic kinetic deficiencies for which this method and device can be exploited to gain additional electrochemical health information which will help provide accurate SoH measurement and prediction methods. In an ideal capacitor there is no chemical reaction taking place and therefore the ionic species kinetic transport limitations are non-existent and do not impact this storage device's performance, i.e. almost instantaneous charge time and almost infinite cycle life. However, ideal capacitors do not have the energy storage capability that would be useful for large critical energy storage back-up applications. In fact, their storage capacities are orders of magnitudes less than that of even the most limited electrochemical storage device (e.g., battery). There are other types of capacitors on the market and in development in which there are chemical reactions taking place and which therefore suffer from ionic kinetic limitations, however; in this disclosure we will utilize the behavior of this ideal capacitor as an example, without implied limitation, to elucidate the effectiveness of the disclosed novel and innovative EIS SoH monitoring method and device.

Figure 1:
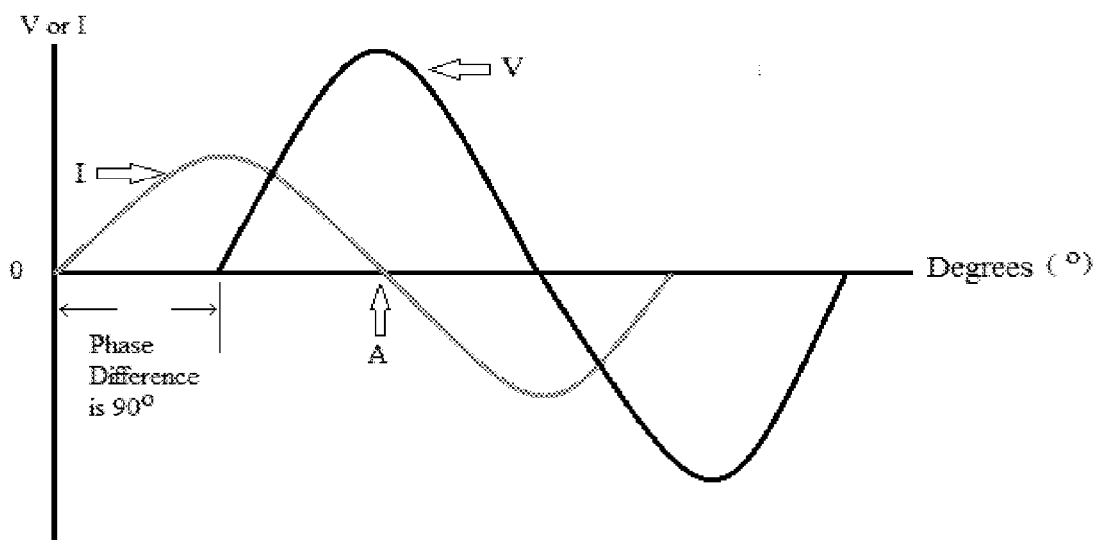
FIG. 1 is a graph illustrating the phase relationship between voltage (V) and current (I) in an ideal capacitor.

The Phase Relationship Between Voltage (V) and Current (I) Across an Ideal Capacitor FIG. 1 is a phase diagram that will be used throughout the remainder of this disclosure to provide insight into the novelty and inventiveness of this method and device. In this disclosure the use of the term 'ideal' in reference to the ideal capacitor is used to elucidate the lack of ionic kinetic deficiencies that plague many other types of electrochemical energy storage and/or energy conversion devices. In this diagram the phase relationship between Voltage (V) and Current (I) when applied to an ideal capacitor is depicted. A very small amplitude sinusoidal voltage is applied across the terminals of the capacitor and the resultant phase difference ($\Delta\theta$) of the current response is measured. In the case of an ideal capacitor this $\Delta\theta$ difference is exactly 90°. One may ask that if we applied V first then why does the current (I) show up first in the phase diagram. This is not intuitive, so it will be discussed briefly. When the electric potential is felt across the capacitor electrodes, electrons start to accumulate on the negative electrode and then they essentially push electrons off the positive electrode, thus leaving that electrode positively charged, and this is when the V across the capacitor electrodes begins to grow. So, when all the electron flow stops (point A in FIG. 1), the maximum V is measured across the capacitor terminals.

The phase relationship depicted in FIG. 1 is that of an ideal capacitor. The only charge carriers involved are electrons and there are no chemical reactions happening within that capacitor and therefore there are no ionic kinetic limitations or deficiencies. Thus, at any given time the measured impedance of this component will oppose the flow of energy to electrons, and not ions. Clearly, if this same V signal was applied across the terminals of a battery, an electrochemical device which does undergo chemical reaction steps, the phase difference $\Delta\theta$ between V and I will be very different. This new phase difference will be a result of many factors, but, the most significant difference will be due to the introduction of a new type of charge carrier, the chemical product ion charge carriers. These ion charge carriers are much slower than electrons and their rates are dependent on many different factors which will be discussed below.

The Single Electrical Excitation Frequency ($\omega_e$) Technique

Early attempts at determining the health of a battery without invoking disruptive and costly test discharges fell short. With this technique, a small sinusoidal electrical excitation voltage is applied across the battery's terminal and the resultant phase difference $\Delta\theta$ of the response current is measured. The clear advantage of this method is that it can be used without taking the critical battery back-up off-line and it is a very fast test. If this method of SoH determination was accurate then it would obviate the need to take the battery pack out of service, and it would eliminate the resultant operational restrictions discussed above. The phase difference $\Delta\theta$ is correlated to the battery's internal impedance ($Z_{INT}$), thus it is an indirect measure of the battery's opposition to the flow of energy and this can be related to the health of the battery. In order to examine this technique closer a typical and accepted model of a flooded type lead-acid battery which will be used and it is depicted in FIG. 2, where:

$R_m$=Metallic Resistance (post, alloy, grid, and gridpaste)
$R_{ei}$=Electrochemical Resistance (paste, seperator, and electrolyte)

Figure 2:
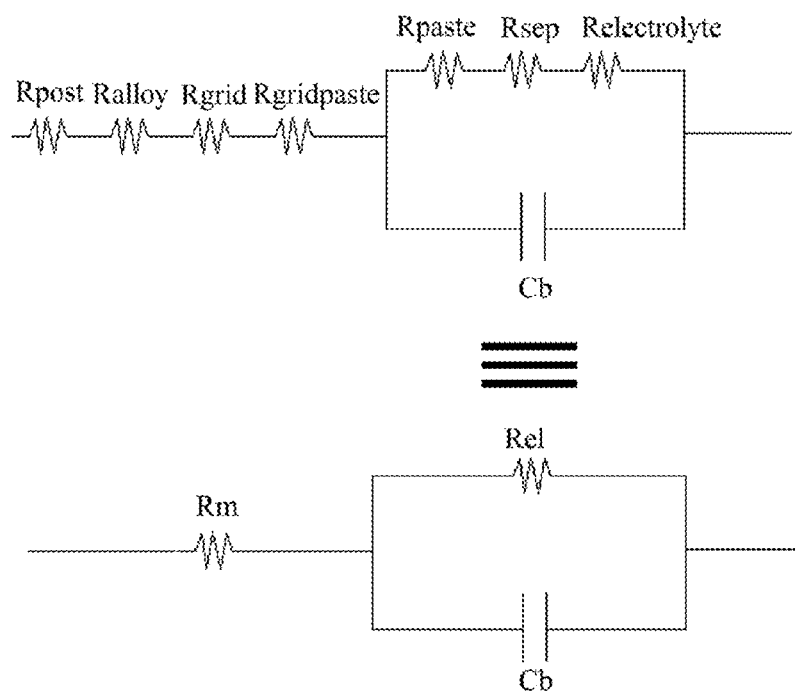
FIG. 2 illustrates a model of a flooded type lead-acid battery.

In FIG. 2, the top depiction models the physical components that offer an opposition to the flow of energy through the battery. The equivalent circuit (the bottom depiction) has grouped these components in order to better describe the battery's behavior as it relates to different types of charge carriers (i.e. ions and electrons). The capacitance symbol ($C_b$)

represents the storage capacity of the battery. The metallic resistance ($R_m$) represents the opposition to the flow to electron charge carriers, and the electrochemical resistance ($R_{el}$) represents the opposition to the flow of ion charge carriers. This breakout of charge carrier oppositions will aid in the following description:

(1) Complex Impedance of Battery ($Z_{INT}$)

$$Z_{INT} = \left( R_m(\omega_e) + \frac{\frac{1}{R_{el}(\omega_e)}}{\frac{1}{R_{el}^2(\omega_e)} + (\omega_e C_b(\omega_e))^2} \right) - j\left( \frac{\omega_e C_b(\omega_e)}{\frac{1}{R_{el}^2} + (\omega_e C_b(\omega_e))^2} \right)$$

where;
$C_b$=Battery Capacitance
$\omega_e$=electrical excitation Frequency

Equation 1 above was derived by performing a simple AC analysis of the equivalent circuit in FIG. 2. $Z_{int}$ is an expression for the total complex impedance of the battery, which represents the opposition to the flow of energy to an AC electrical excitation signal with a frequency ($\omega_e$). As a note: If a DC signal is applied, then $\omega_e$=0, and the $Z_{Int}$ expression simplifies to $Z_{int}=R_m+R_{el}$.

(2) Voltage (V) and Current (I) phasor relationship $$\frac{V\sqrt{\theta_e}}{I} = Z_{INT}$$

Where;
$\theta_e$=Phase Angle due to electrical frequency excitation

Equation 2 above is an expression of the phase relationship between V, I and $Z_{INT}$. This is merely Ohm's Law rearranged and in its complex form. The resultant phase angle ($\theta_e$) is presented with sub-script (e), and this is associated with the electrical excitation frequency ($\omega_e$) presented in Equation (1). These subscripts are not typically shown, but this granularity will be useful in demonstrating the novelty of the method being disclosed.

As shown in Equations (2), the phase angle ($\theta_e$) can be correlated to $Z_{INT}$. It should be recognized that if $Z_{INT}$ changes its response to an AC excitation signal, for any reason, then its resultant complex impedance response, at a certain frequency ($\omega_e$), will change as well and will result in a different phase angle ($\theta_e$). If it is assumed that the V, I and $\omega_e$ between various measurements are the same, then the resultant phase angle ($\theta_e$), the measured parameter, will be dependent on $Z_{INT}$ only. Thus, the phase angle response between V and I at a specific frequency ($\omega_e$) can be correlated to the complex impedance $Z_{INT}$ of a battery at the time the measurement is taken and in theory can be used to indirectly determine the health of a battery. However, in practice, this method is far from accurate as will be discussed later in this disclosure.

the Battery's Complex Impedance $Z_{INT}$

As the battery ages the available active material (energy capacity—A-hrs) decreases, lead sulfate and other tertiary compounds crystallize and form unwanted bonds, causing non-rechargeable masses to form on, around and within the electrode paste, the charge acceptance declines, the cyclic efficiency falls off, the power density declines, and eventually the battery cannot serve its intended function. Each of the components in FIG. 2 are effected by battery aging phenomenon in a different way and each of their contributions will impact the battery's complex impedance ($Z_{INT}$) in a different way. This will show up in a difference in the measured phase angle ($\theta_e$) between the V and I at a specific frequency ($\omega_e$). In Equation 1 above, it is clear that $R_m$, $R_{el}$, $C_b$ and $\omega_e$ all affect the complex impedance response to an electrical excitation signal.

In addition to aging phenomenon, there other battery conditions that also affect the complex impedance response of the battery, such as; the State-of-Charge (SoC), the battery's internal Temperature (T), the battery design, and the battery manufacturing tolerances and process. These conditions affect the battery components, and their contribution to $Z_{INT}$, and this also results in a difference in the measured phase angle ($\theta_e$). A closer look into how each of these components are affected by these factors is necessary in order to better understand the problems with the accuracy of the single frequency excitation measuring technique. The key to understanding the limitations on the accuracy which is possible with the single frequency excitation method is to understand the variability that is introduced into this measurement technique by the different components in the battery model depicted in FIG. 2. Each of these components are impacted differently by the battery's age, SoC, temperature and its design (material and construction), manufacturing and process tolerances. In order for this technique to be an accurate and trusted SoH monitor it must reveal information about the true electrochemical health of the battery. Its measurement result cannot be altered by battery conditions such as SoC, temperature and its design or it will not supply the proper information to the battery user in order for them to make critical and costly decisions about their battery pack.

How does Battery Aging Affect $Z_{INT}$?

In general, $R_{post}$, $R_{alloy}$ and $R_{grid}$, which are all components of $R_m$, are not significantly impacted by battery aging. However, the following components are affected:

a) $R_{Gridpaste}$, a component of $R_m$. During the first several cycles of a lead acid battery the bonding between the grid and paste tends to get stronger, after that, the bonds tend to break down. Thus, the contribution of this component to the resultant phase angle ($\theta_e$) will cause it to go one way at the beginning of life and then go the other way as the battery ages, further adding to the variability of this type of measurement technique.

b) $R_{paste}$, a component of $R_{el}$, increases as the battery ages and this is mainly a result of unwanted tertiary compounds, i.e. lead oxides and basic lead sulfates (tribasic and tetrabasic), precipitating out of solution in unbalanced alkalinity conditions during the discharge. These tertiary compounds interact and establish bonding relationships with the rechargeable $PbSO_4$ volume and the electrode, on the surface of the electrode and within its pores. These interactions (i.e. bonds) are mainly of the covalent or even metallic type, but regardless of the type, they are undesired because they negatively impact the storage device's capacity. This effectively limits the flow and subsequent ionic transfer of the electrolyte's chemical ion products and presents itself as an increase to the opposition of the flow of energy, that is, an increase in $Z_{INT}$. This is essentially a decrease in the active material utilization (measure of the battery's capacity—A-hrs). One can see how this negatively impacts both the discharge and charge of the battery. During discharge there is less active material available to undergo energy conversion, and during recharge any additional compounds and/or bonding that is created during the discharge reaction must be undone during the recharge reaction (i.e., decrease in charge acceptance). The resultant contribution of this component tends to increase the phase angle ($\theta_e$) as the battery ages thus further adding to the variability of this measurement technique.

c) $R_{sep}$, a component of $R_{el}$, tends to break down as the battery ages and this also affects the resultant phase angle ($\theta_e$), thus further adding to the variability of this measurement technique.

d) $R_{electrolyte}$, a component of $R_{el}$, is rather complicated since there are so many different types of electrolytes currently used in the industry: Liquid, Gel, and Absorbent Glass Matting (AGM), etc. The list is large and the aging mechanism of each is different, some worst then others; however, in general, the contribution of this component to the resultant phase angle ($\theta_e$) will be affected by battery age thus further adding to the variability of this type of measurement technique.

e) $C_b$, a component of the battery model in FIG. 2 is also affected by aging. Since $C_b$ is a measure of the battery's internal capacitance the same aging effects described for $R_{Paste}$ and $R_{Electrolyte}$ also affect the battery's capacity to supply energy. Generally the variability of the measurement technique due to this component increases as the battery ages.

How does Battery State-of-Charge (SoC) Affect $Z_{INT}$?

In general, $R_{post}$, $R_{alloy}$, $R_{grid}$, $R_{gridpaste}$, which are all components of $R_m$, and $R_{sep}$, components of $R_{el}$, are not significantly impacted by the battery's SoC. The following components are affected:

a) $R_{electrolyte}$, a component of $R_{el}$, is highly dependent on the battery's SoC. The opposition to the flow of energy, i.e. ions, increases as the concentration of the $SO_4^{--}$ in the electrolyte solution goes down. Effectively, there are less $SO_4^{--}$ to react with the active material ions ($Pb^{++}$) and this presents itself as an increase to the opposition of flow. Therefore, the contribution of this battery condition will change the resultant phase angle ($\theta_e$), thus, further adding to the variability of this measurement technique. This variability also increases as the battery discharge continues.

b) $R_{paste}$ a component of $R_{el}$, is dependent on the battery's SoC. If the battery cell is not fully charged than there is lead sulfate layer on the surface and within the pores of the plate. Thus, this layer increases the opposition to the flow of ions. Therefore, the contribution of this battery condition will change the resultant phase angle ($\theta_e$), thus further adding to the variability of this measurement technique. This component of $R_{el}$ is also the component that causes the battery's terminal voltage to go down when the battery reaches very low SoC. During the first major portion of the discharge of a lead acid battery the output voltage is relatively constant, however, near the end of discharge the voltage rapidly decreases. As $Z_{INT}$ rapidly increases this marks the end of discharge. Thus, the contribution of this battery condition will also change the resultant phase angle ($\theta_e$) and the variability of this measurement technique will increase as the discharge continues c) $C_b$, a component of the battery model in FIG. 2 is also affected by SoC. If the battery cell is not fully charged than there is lead sulfate layer on the surface and within the pores of the plate. Thus, this layer alters the permittivity of the cell thus affecting the representative capacitance of the cell. Therefore, the contribution of this battery condition will change the resultant phase angle ($\theta_e$), thus further adding to the variability of this measurement technique.

How does Battery Temperature Affect $Z_{INT}$?

In general, $R_{Sep}$, a component of $R_{el}$, could be temperature sensitive, but, in general it is not over the temperature ranges of interest, therefore in most practical situations this component will have minimal impact on the resultant phase angle ($\theta_e$). The effects of the contribution of temperature on $C_b$ is minimal compared to the effects noted below. The following components are affected by temperature:

a) $R_{Grid}$, $R_{Alloy}$, $R_{post}$, and $R_{Gridpaste}$, components of $R_m$, are temperature sensitive. Therefore, a majority of the metallic opposition ($R_m$) to the flow of energy, i.e. electron flow, depends of the battery's temperature when the measurement is taken. Thus, this battery condition affects the contribution that these components add to the resultant phase angle ($\theta_e$), further adding to the variability of this measurement technique.

b) $R_{electrolyte}$, and $R_{Paste}$, components of $R_{el}$, are highly sensitive to temperature. Anytime one heats up a chemical reaction the reaction rate will increase. Thus, this battery condition affects the contribution that these components add to the resultant phase angle ($\theta_e$), further adding to the variability of this measurement technique.

How do Battery Design, and/or Manufacturing Tolerances and Process Affect $Z_{INT}$?

In general, all the components of the battery are affected by its design/manufacturing tolerances and process. However, some are not as significant as others.

a) The components of $R_m$ are subject to variations based on different battery designs and the materials used. More importantly, these components are highly susceptible to manufacturing tolerances and processes, i.e. various welding/bonding techniques. Each manufacturer makes the battery slightly different, therefore the complex impedance response for the same battery chemistry will be different. Just because all the batteries are of the same lot does not mean their electrical response characteristics are the same. Manufacturing batteries is a messy and highly variable process. Particularly, every battery will have its own impedance signature, thus affecting the resultant phase angle ($\theta_e$) and further adding to the variability of this measurement technique.

b) The paste, separator and electrolyte are tightly controlled via industry regulations. $R_{paste}$, $R_{sep}$ and $R_{electrolyte}$, components of $R_{el}$, and are less susceptible to design, manufacturing tolerances and/or process variations. Nonetheless, the complex impedance response and thus the resultant phase angle ($\theta_e$) are affected by this factor, thus, adding to the variability of this measurement technique.

c) Clearly $C_b$ is very dependent on the design and manufacturing process and therefore this battery condition affects the contribution that this component adds to the resultant phase angle ($\theta_e$), further adding to the variability of this measurement technique.

It is worth noting that since each battery is a bit different, i.e. has a different electrical excitation frequency response, the actual EIS equipment that different manufacturers design also add to the variability of this measurement technique. So even a battery from the same lot and under tight industry regulation will respond differently and different conclusions will be drawn on the health of the battery, based on the resultant phase angle ($\theta_e$), because the EIS manufacturer uses a different electrical excitation frequency. Manufacturers have not settled on the same (the right) electrical excitation frequency and this alone adds variability to this measurement technique.

In summary, the single frequency measurement technique comes with significant measurement variability and this takes away from its accuracy. Therefore, any results from this technique will remain in question and its ability to eliminate the costly, restrictive and time consuming test discharge has fallen short. At best, this technique may be useful in identifying imminent failure, i.e. a rogue cell, but this is too little, too late. Consequently, based on the inherent variability in this measurement technique, if it were the only indicator the utility used in determining the health of a battery pack then costly 'premature' battery pack replacement would be likely based on uncertainty alone.

Figure 3:
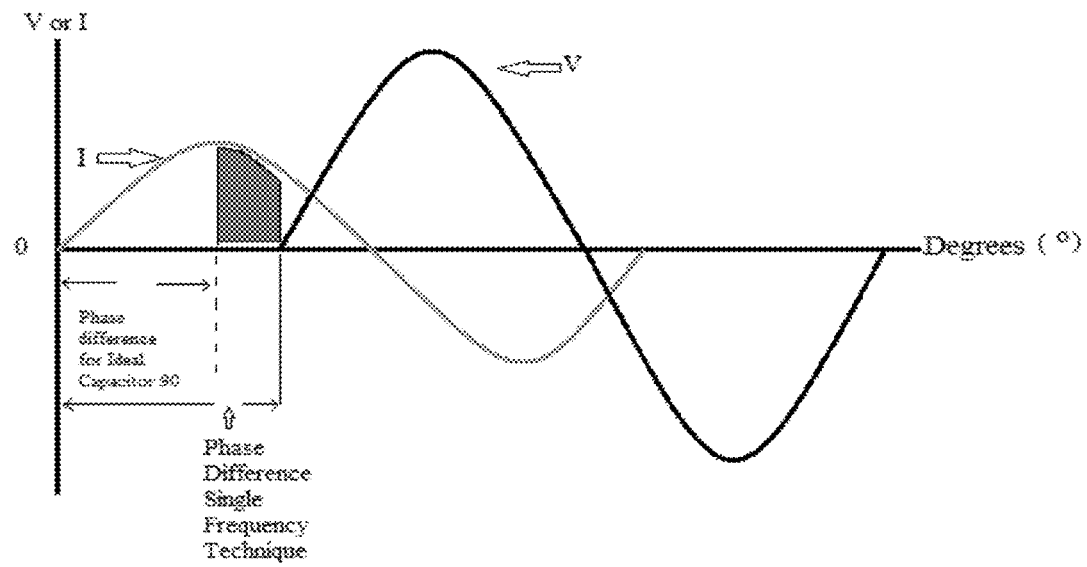
FIG. 3 is a graph illustrating the phase relationship between voltage (V) and current (I) using a single-frequency EIS technique.

FIG. 3 shows the resultant phase angle ($\theta_e$) using the single excitation frequency EIS technique. The green shaded area is representative of the phase difference from that an ideal capacitor would present at the same frequency (recall from FIG. 1 that for an ideal capacitor V reaches a maximum or minimum just as I is zero, and vice versa). The difference is based on the battery's inherent kinetic transport limitations, i.e. slower ion flow, but, it is also comprised of the variability and uncertainly that was a result of the change in the battery's complex impedance response from the effects of aging, SoC, temperature, and battery design, manufacturing tolerances and/or processes. Therefore, it should be clear that only part of the green shaded area truly represents the battery's SoH, it's age, and the rest represents inherent features of the battery even for a brand new battery with excellent SoH.

One could surmise that each of the EIS equipment suppliers could determine the complex impedance response of each and every battery that is available and use this beginning of life measurement to yield better results. This equipment manufacturer could keep an extensive database so when their equipment was used it would give a better indication of that battery's health. However, this is a daunting task to say the least; first battery manufacturers are not that forthcoming with battery data and they would most likely not provide this initial measurement, secondly there are way too many types of batteries available to keep track of, and finally this would only remove some of the variability's discussed above. Therefore, this attempt would significantly complicate and add cost to this measurement technique and the benefits for undertaking this approach would be obviated by the remaining variability (inaccuracy) that was still in the measurement.

True State-of Health (SoH) Meaning

SoH has many different meanings and is often misinterpreted. True SoH measurement is supposed to give the user a better understanding of the chemical potential energy (Joules) that is available for conversion to useable electrical energy (A-hrs) when the battery is called upon. If the measurement technique used is influenced by factors such as SoC, temperature, and battery design, manufacturing tolerances and/or process, as is the single frequency excitation technique, then the user will not be presented with the right information to make a decision whether or not to replace the battery pack. This uncertainty is costly to say the least and thus this is why utility companies still to this day rely on costly, restrictive, and time consuming periodic test discharges.

What we really want to know from a SoH measuring technique is the battery pack's true electrochemical health. The SoC, temperature and battery design, manufacturing tolerances and/or process, and their contributions to the battery's complex impedance response, and resultant phase angle response, does not tell us whether or not our battery pack is healthy and we need a way to factor these out. What we really need to know in order to make an informed decision about our battery's health is how old is it, the battery's age in electrical terms! Clearly, we want to know how our battery pack has aged based on the regimen we have put it through. So, in order for a measuring technique to be informative we need to eliminate the variability that is introduced by its components based on SoC, temperature, and battery design, manufacturing tolerances and processes and we also need to eliminate the variability introduce by different EIS measuring equipment. As discussed previously, each EIS device manufacturer uses different electrical excitation frequencies and this alone introduces measurement variability. If one could get all the manufactures to use the same electrical excitation frequencies then this variability could be substantially reduced, but this is highly unlikely. The resultant measurement needs to tell us about how the age of the battery is going to impact its ability to serve its intended function when called upon, Joules to A-Hrs conversion. Thus, the measuring technique needs to somehow eliminate the variability's discussed above.

From FIG. 3, the ultimate goal is to reduce the green shaded area, which would mean that some of the variability introduced by factors other than battery aging would have to be eliminated and the resultant measurement would be more indicative of the battery's true SoH, i.e. its electrochemical health.

Dual Electrical Excitation Frequency ($\omega_e^1$ and $\omega_e^2$) Attempt

As a natural response to the shortcomings of the single frequency measurement method, an attempt was made to use two electrical excitation frequencies, $\omega_e^1$ and $\omega_e^2$ respectively. The goal here was to extract additional electrochemical health information, by eliminating some of the variations introduced by non-relevant factors, by exciting the battery with two different electrical excitation frequencies, close in time. However, this method also fell short. The following relationships illustrate this concept:

(3) Complex Impedance of Battery ($Z_{INT}$), with $\omega_e^1$ and $\omega_e^2$ $$Z_{INT}^1 = \left( R_m(\omega_e^1) + \frac{\frac{1}{R_{el}(\omega_e^1)}}{\frac{1}{R_{el}^2(\omega_e^1)} + (\omega_e^1 C_b(\omega_e^1))^2} \right) - j\left( \frac{\omega_e^1 C_b(\omega_e^1)}{\frac{1}{R_{el}^2(\omega_e^1)} + (\omega_e^1 C_b(\omega_e^1))^2} \right)$$

$$Z_{INT}^2 = \left( R_m(\omega_e^2) + \frac{\frac{1}{R_{el}(\omega_e^2)}}{\frac{1}{R_{el}^2(\omega_e^2)} + (\omega_e^2 C_b(\omega_e^2))^2} \right) - j\left( \frac{\omega_e^2 C_b(\omega_e^2)}{\frac{1}{R_{el}^2} + (\omega_e^2 C_b(\omega_e^2))^2} \right)$$

Where;
$\omega_e^1 = 1^{st}$ electrical excitation Frequency
$\omega_e^2 = 2^{nd}$ electrical excitation Frequency (4) Voltage (V) and Current (I) phasor relationship, with $\omega_e^1$ and $\omega_e^2$ $$\frac{V\sqrt{\theta_e^1}}{I} = Z_{INT}^1$$

$$\frac{V\sqrt{\theta_e^2}}{I} = Z_{INT}^2$$

Where;
$\theta_e^1$
=Phase Angle difference between V and I due to $1^{st}$ electrical frequency excitation
$\theta_e^2$
=Phase Angle difference between V and I due to $2^{nd}$ electrical frequency excitation In Equation 4, there are two different complex internal impedances responses, $Z_{INT}^1$ and $Z_{INT}^2$. The battery responds differently because it is being excited by a different electrical excitation frequency and the resultant complex internal impedance response to each is different. Some of the components that make up the battery's complex internal impedance ($Z_{INT}$) present a different opposition to the various frequencies with which they are excited. The components that make up $R_m$ (the metallic opposition, electrons) are not very frequency sensitive at the frequencies of interest. However, the components that make up $R_{el}$ (the electrochemical opposition, ions) are sensitive at all frequencies. Additionally, the capacitive component, in FIG. 1, and its contribution to the complex impedance response of the battery is also frequency sensitive. Thus, it should be clear, that the two expressions for $Z_{INT}$ in Equation 4, $Z^1_{INT}$ and $Z^2_{INT}$, will have a different response to different excitation frequencies, $\omega_1$ and $\omega_2$ respectively. But, recall that the main problem with the single frequency method was that the complex impedance response, and it's resultant phase angle, was highly dependent on the age, SoC, temperature and various design, manufacturing tolerances and/or process. So, in order for this approach to be effective, and to instill confidence in this electronic battery SoH measurement technique, it would have to eliminate all of these dependencies so that the resultant measurement is truly indicative of the cell's age.

This measurement technique takes the difference of the resultant phase angle response, $\theta_e^1$ and $\theta_e^2$, measured at the terminals of the battery, and this provides additional insight into the battery's internals and this aids in determining the true SoH of the battery. One would think that this two frequency approach is far superior to the single frequency approach; however, it is the intent of this disclosure to show otherwise. Just using two electrical excitation frequencies taken close in time is not enough to make this method of measurement acceptable in the industry. There are other variations of this concept that have been explored, e.g. scanning through a wide range of frequencies and measuring several resultant responses, all of the electrical excitation type. These attempts have merit but they are also limited and they too have several variations in the response which make these measurements unreliable as well. The added scanning significantly complicates the required electronics and greatly raises the cost. One must keep in mind that the utility or end user is not going to pay more for a battery monitoring system then the battery itself. This would not make much business sense; why not just replace the battery when it is suspect. So, the goal is to eliminate the variation without complicating the required electronics and increasing the cost.

(5) The battery internal impedance difference $\Delta Z_{INT}$ based on (3) is:

$$\Delta Z^e_{INT} = Z^{e1}_{INT} - Z^{e2}_{INT} = \left( \begin{array}{c} \frac{\frac{1}{R_{el}(\omega_e^1)}}{\frac{1}{R_{el}^2(\omega_e^1)} + (\omega_e^1 C_b(\omega_e^1))^2} - \\ \frac{\frac{1}{R_{el}(\omega_e^2)}}{\frac{1}{R_{el}^2(\omega_e^2)} + (\omega_e^2 C_b(\omega_e^2))^2} \end{array} \right) - j \left( \begin{array}{c} \frac{\omega_e^1 C_b(\omega_e^1)}{\frac{1}{R_{el}^2(\omega_e^1)} + (\omega_e^1 C_b(\omega_e^1))^2} - \\ \frac{\omega_e^2 C_b(\omega_e^2)}{\frac{1}{R_{el}^2(\omega_e^2)} + (\omega_e^2 C_b(\omega_e^2))^2} \end{array} \right).$$

The impedance difference in Equation 5, although tedious, represents the advantages of the dual electrical frequency approach. Most importantly, this complex impedance response does not contain $R_m$ which drops out when taking this difference, and as will be recalled from the single frequency method description this term was present in the complex impedance ($Z_{int}$) and added variability to the measured phase angle ($\theta_e$). Only one component of $R_m$, $R_{gridpaste}$, was affected by age, but all the components of $R_m$; $R_{post}$, $R_{alloy}$, $R_{grid}$ and $R_{gridpaste}$ were all affected by temperature and the battery design, manufacturing tolerance and/or process. Thus, eliminating this term from the complex impedance expression was a step in the right direction. That is, this dual frequency excitation difference method eliminated the effects that two of the battery's conditions, i.e. temperature and the battery, its design, manufacturing tolerance and/or processes, had on $R_m$, and thus reduced this contribution to the variability of the measurement.

Figure 4:
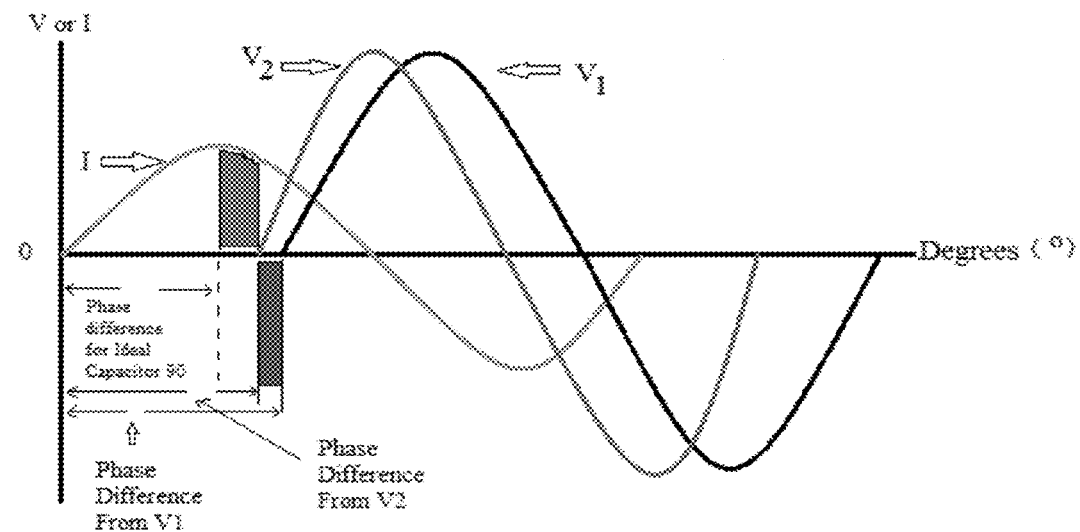
FIG. 4 is a graph illustrating the phase relationship between voltage (V) and current (I) using a dual-frequency EIS technique.

By exciting the battery close in time and taking the difference of the phase response of two distinct electrical excitation frequencies two of the large contributors to the variation of the measurement have been eliminated. Hence, the variability in this measurement technique has been reduced, and closer approaches a measurement that is more representative of the true SoH of the battery, its age. Essentially, since the temperature did not change and the battery design is the same between the two measurements their contribution to the variability in the measurement is eliminated. FIG. 4 shows that the green shaded area in FIG. 3 above has been reduced by this dual frequency approach. The red shaded area represents the variability that was removed by eliminating the effects of temperature and battery design, manufacturing tolerances and/or process on $R_m$.

However, from Equation 5 it is shown that $Z_{INT}$ is still dependent on $R_{el}$, $C_b$ and $\omega_e$. As described earlier, $R_{el}$ is affected by the battery's age, SoC, temperature and battery design, and manufacturing tolerances and/or processes. So even with this dual frequency excitation difference approach there will still be significant variability in the measurement and it is not all due to the battery's age. The main goal of the dual frequency approach was to eliminate the variation in measurement so that it better represented the true health of the battery, however, in doing so, this measurement technique actually added variability into the measurement results. Since, the components that make up $R_{el}$ will behave differently to different electrical excitation frequencies this behavior manifests itself the difference measurement. Thus, new unknowns have been added to the measurement technique that were non-existent in the single electrical excitation technique. Therefore, the selection of the second excitation frequency alone will yield different results in the measured phase angle difference, $\Delta \theta_e$.

It is clear that even though the dual frequency approach helped, and was superior to the single frequency approach, it still has limitations in its ability to accurately measure the SoH of a battery. The variations induced by different battery types and material, i.e. paste, separator and electrolyte, aging, SoC, temperature, are still present within the $\Delta Z_{INT}$ expression in Equation 5 and they are a direct result of the variations in $R_{el}$ and its frequency response to two distinct electrical excitation frequencies.

It is worthy to note that much study and exploration has been expended on the electrical frequency selection for this type of measurement method. From Equation 5 it is evident that the value of both $\psi_e^1$ and $\psi_e^2$ will affect the phase difference, $\Delta \theta_e$. Meaning, if two identical batteries are tested and all other parameters remained equal one would get two different $\Delta \theta_e$, if one used two differently supplied EIS equipment. This is not visible to the end-user because the equipment manufactures draw their own conclusions on what the actual SoH is based on the phase difference response seen by their system. The real goal was to reduce variability in the measurement of SoH, in order to get the true electrochemical health of the battery, now we have even furthered the level of variation: the EIS equipment supplier's selection of two electrical excitation frequencies. So, we eliminated some of the variability of the single excitation technique but added some variability based on our enhanced measurement technique. Thus, this tends to keep the green shaded area in FIG. 4 larger than it should be. Consequently, it is not surprising that one EIS vendor may say that their system is superior based on frequency selection, but, as we have disclosed, all EIS equipment using this electrical measurement method is subject to the variations brought on by $R_{el}$. Albeit, the variation may be less from one frequency selection to the next, however, this difference is marginal at best. Certainly not a 'real' performance differentiator in the market place!

The Mechanical Excitation Frequency ($\omega_m$) and Single Electrical Excitation Frequency ($\omega_e$) Method As shown the single and dual electrical excitation frequency approaches both have their advantages and disadvantages. The evolution of EIS techniques/technologies has grown in complexity and cost but the performance, i.e. their ability to accurately measure SoH, has not grown in proportion. It is disclosed here that there is a much more accurate method for determining the actual SoH of a battery. The principle behind this method is to introduce a mechanical excitation frequency $\omega_m$, as is disclosed in U.S. Pat. No. 7,592,094. This prior art demonstrates that the introduction of a mechanical excitation frequency $\omega_m$, to an energy storage device makes the device operate much more efficiently and will substantially minimize the storage device's degradation. This disclosure is focused on the advantages that mechanical excitation can additionally have on one's ability to accurately determine the battery's true SoH, its age. This adds value to the use of mechanical excitation in the energy storage market place, meaning, if the utility is taking advantage of the performance and cycle life improvements that mechanical excitation offers then it makes commercial business sense to take advantage of this novel and industrious method of SoH determination. The combination of both mechanical excitation for improved performance and life and a better and more accurate SoH measurement technique will change the face of energy storage as we currently know it.

It will be demonstrated that the variations brought on by $R_{el}$, in the single and dual electrical excitation frequency can be all but eliminated by the proper application of a mechanical excitation frequency ($\omega_m$). As discussed above, the expression for $\Delta Z_{INT}$ in Equation 5 was effected by the battery's SoC, temperature and various design, manufacturing tolerances and/or process as well as the device's age, i.e. SoH. When testing a string of batteries with the same electrical excitation measurement device, the user will get a different $\Delta \theta_e$, i.e. SoH, reading for each battery in the string. The goal of any measurement technique is to ensure that the measured $\Delta \theta_e$ is indicative of the battery's true SoH, and of that alone.

To illustrate, take a string of batteries and envision that we are going to test each one individually. Each battery in the string will be at a different age, even if the string was comprised of batteries from the same lot and placed into service at the same time. The problem is that each battery cell charges and discharges at different rates throughout its life and this is mainly due to differences in its internal impedance ($Z_{INT}$) and imbalances between cells in the string. These are the same differences that make the current electronic excitation means of determining the battery's true SoH very inaccurate and unreliable. Therefore, each cell will be at a different cycle life, a.k.a. age. Often, one confuses cycle life with calendar life but the differentiation is critical.

Since it was already determined that $R_{el}$'s magnitude is sensitive to aging mechanisms, part of each cell's complex impedance response to an electrical excitation frequency, and the corresponding $\Delta \theta_e$, is due to age. The question is how much of the measured phase difference can be attributed to age? After all, this is what everyone is looking for since the battery's true SoH is, or more correctly, should be, a measure of its electrochemical health, e.g. its ability to convert chemical potential energy to electrical energy then back again. So, what we really want to know is how the paste, separator and electrolyte will interact, i.e. the energy conversion process, when called upon for service. The effects from the battery's SoC, temperature, and design, manufacturing tolerance and/or process should not be present in the measurement. Even though these parameters play a part in what the battery will supply, i.e. capacity—A-hrs, for its given state, one should not mislead one into prematurely replacing a battery pack based on the variability they add to the chosen measurement technique. All we really want in the measurement result are the effects that are due to the battery's age! $R_{el}$'s magnitude in response to an electrical excitation frequency, or the difference in the response from two electrical excitation frequencies, alone is descriptive, but it is also very deceiving and this inherent uncertainty directly effects a utility's bottom line, i.e. cost! Clearly, if a battery pack's SoH is in question based on the results of the applied measurement technique then this will drive the utility to performing a costly and operational restrictive test discharge which, as explained earlier, actually detracts from the battery pack's useful life. Therefore, the purpose of this novel, inventive and industrious mechanical excitation technique is to remove this inherent uncertainty in the electronic measurement technique, thereby, obviating the need to conduct frequent and costly test discharges.

$R_{el}$ is comprised of three components; $R_{Paste}$, $R_{Sep}$ and $R_{electrolyte}$, their individual magnitude response to an electrical excitation frequency will be analyzed below:
1. $R_{Paste}$, $R_{Sep}$, $R_{electrolyte}$ and $C_b$ are sensitive to aging, thus adding variability to resultant $\Delta \theta_e$
2. $R_{paste}$ and $R_{electrolyte}$ are sensitive to temperature, thus adding variability to resultant $\Delta \theta_e$
    a. As discussed earlier $R_{Sep}$ could be sensitive to temperature, but in general, in most practical circumstances, it is not in the temperature range of interest.
3. $R_{eletrolyte}$, $R_{Paste}$ and $C_b$ are sensitive to SoC, thus adding variability to resultant $\Delta \theta_e$
4. $R_{Paste}$, $R_{Sep}$, $R_{electrolyte}$ and $C_b$ are susceptible to battery material and manufacturing tolerances and/or process, thus adding variability to resultant $\Delta \theta_e$ Thus as can be seen each of these component's magnitude response to an electrical excitation frequency are impacted by the conditions noted above, thus adding to the variability of the resultant measured phase angle $\theta_e$. Therefore the true effects of aging on the electrochemical health of the battery, i.e. SoH, are masked by the effects of temperature, SoC and the battery design, manufacturing tolerances and/or processes. It is also subject to the EIS equipment design and tolerances as well as this equipment supplier's interpretation of the electrical excitation measured response.

By measuring the internal impedance with and without a mechanical excitation frequency ($\omega_m$) and only using a single electrical excitation frequency ($\omega_s$) the influences of the temperature, SoC and battery design, manufacturing tolerances and/or processes on the measured phase angle $\theta_e$ can be eliminated and the resultant measured $\theta_e$ will be indicative of the true electrochemical health, i.e. SoH (age), of the battery. This mechanical measurement technique also reduces the response's susceptibility to the EIS equipment design and tolerance and substantially reduces variance introduced by the designer's interpretation of the result measured response.

(6) Battery Internal impedance difference, with $\omega_e$ and $\omega_m$, $\Delta Z_{INT}^{\omega_e}(\omega_m)$, compare to equation (5) in which both applied frequencies are electrical.

$$\Delta Z_{INT}^{\omega_e}(\omega_m) = Z_{INT}^{\omega_e} - Z_{INT}^{\omega_e}(\omega_m) =$$

$$\left( \frac{\frac{1}{R_{el}(\omega_e)}}{\frac{1}{R_{el}^2(\omega_e)} + (\omega_e C_b(\omega_e))^2} - \frac{\frac{1}{R_{el}(\omega_m)}}{\frac{1}{R_{el}^2(\omega_m)} + (\omega_e C_b(\omega_m))^2} \right) - j \left( \frac{\omega_e C_b(\omega_e)}{\frac{1}{R_{el}^2(\omega_e)} + (\omega_e C_b(\omega_e))^2} - \frac{\omega_e C_b(\omega_m)}{\frac{1}{R_{el}^2(\omega_m)} + (\omega_m C_b(\omega_m))^2} \right)$$

Constraints on Electrical Excitation
(7)

$$(\omega_e C_b)^2 \gg \frac{1}{R_{el}^2} \text{ and } (\omega_e C_b(\omega_m))^2 \gg \frac{1}{R_{el}^2(\omega_m)}$$

Equation 6 can be manipulated and transformed by using constraints similar to that shown in Equation 7. One should keep in mind that there are other constraints on electrical excitation frequency selection that have been learned and applied by EIS equipment suppliers over decades of use and that these should also be considered during the implementation of this disclosed measurement technique. The mechanical excitation frequency selection is dependent on electrochemical constraints, i.e. chemical reactions and battery chemistry, which will be discussed later in this disclosure. The $Z_{INT}$ expression in Equation 6 represents the battery's complex internal impedance and reveals its dependency on both the electrical and mechanical excitation frequency. Equation 8 and 9 below represent the polar form of the battery's internal impedance ($Z_{INT}$) and are used for illustrative purposes, and show that the resultant magnitude of $Z_{INT}$ and the resultant phase shift $\theta_e$ between V and I is different when mechanical excitation $\omega_m$, is applied while taking a single electrical frequency measurement. The phase shift $\theta_e$ (Equation 8) is a result of electrical excitation and it is dependent on the mechanical excitation $\omega_m$ (Equation 9). The differences in the phase shift $\theta_e$ with and without mechanical excitation are due to the contributions of $R_{el}$ and $C_b$ in Equation 6 above.

$$\Delta Z_{INT}^{\omega_e} \angle \theta^e \text{ without mechanical excitation} \quad (8)$$

$$\Delta Z_{INT}^{\omega_e}(\omega_m) \angle \theta^e(\omega_m) \text{ with mechanical excitation} \quad (9)$$

This difference expression for $Z_{INT}$, with and without mechanical excitation, reveals very pertinent electrochemical health information about the battery. From FIG. 5 the difference from the single electrical excitation phase response, and the single electrical excitation phase response with mechanical frequency excitation (the red shaded area), can be used to better ascertain the true SoH of the battery (the green shaded area). Essentially, this phase difference is with and without mechanical excitation is measured, and the resultant difference (green shaded area) is indicative of the electrochemical health of the battery.

Figure 5:
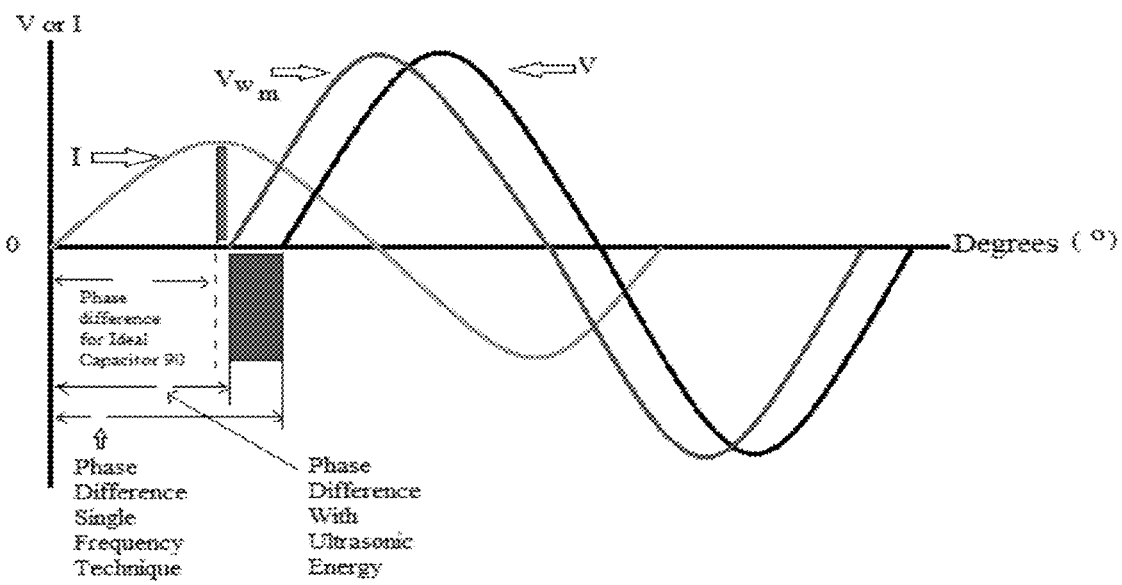
FIG. 5 is a graph illustrating the phase relationship between voltage (V) and current (I) using an ultrasonic technique.

The green shaded area (above the horizontal axis) in FIG. 5 does not have the variability that plagued the single electrical excitation method with the exception of that induced by the age of the device. These measurements are taken very closely in time in an environment in which the temperature is held substantially constant, therefore, temperature does not affect the change in the magnitude response of $R_{el}$ with and without mechanical excitation, SoC does not affect the change in the magnitude response of $R_{el}$ with and without mechanical excitation, and, finally the battery design, manufacturing tolerances and/or processes do not affect the change in magnitude response of $R_{el}$ with and without mechanical excitation. These variability's are represented by the red shaded area (below the horizontal axis) in FIG. 5. All that affects the magnitude of $R_{el}$ in this measurement technique is the effect of the mechanical excitation signal ($\omega_m$) on the opposition to the flow of energy. Therefore, the battery's internal complex impedance response is not only dependent on the electrical excitation frequency ($\omega_e$) it is also a function of the mechanical excitation frequency ($\omega_m$).

By applying mechanical energy at the proper frequency and amplitude the kinetic transport deficiencies of the reaction ions are mitigated. The result is a reduction in $R_{el}$ and this in turn will impact the complex impedance response and corresponding phase angle. This reduction in $R_{el}$ is at the electrode-electrolyte interface and it is mainly due to the $R_{paste}$ and $R_{electrolyte}$ contribution. This is accomplished by the interaction of the mechanical wave and the subsequent altering of limiting pore sizes that are formed within the insulator layer ($PbSO_4$) that is found all over the electrode reaction area during discharge. The mechanical waveform is at a frequency which ensures that the pore dimensions are kept large enough to allow/ensure passage of the larger and less energetic reaction product ions ($HSO_4^-$ and $SO_4^{--}$) so that their concentration levels and corresponding ionic fluxes are generally higher and they are more able to rapidly change, at distances that are closer to the electrode surface, in response to changes in the $Pb^{++}$ ion flux (which are based on electrode potential changes). If the mechanical energy does not reduce $R_{el}$ then the electrochemical health of the cell is in question. As the battery ages the effects of mechanical energy on the magnitude of $R_{el}$ will slowly diminish overtime, and will result in less of an impact on the battery's complex impedance response and therefore less of a change in the resultant phase angle.

It should also be seen that the variance introduced by the EIS equipment itself has been eliminated from the resultant complex impedance response and thus does not contribute to the variability in this measurement technique, as long as the electrical excitation frequency selection is sufficient so that the constraints illustrated in Equation 7 hold true.

The only thing that will influence the change in the magnitude response of $R_{el}$ is the predetermined mechanical excitation signal. In this measurement technique the only variability introduced will be due to the effects of aging on $R_{el}$ and $C_b$. This is the goal of any EIS measurement technique.

True State-of-Health (SoH) Measurement Using Single Electrical ($\omega_e$) and Mechanical ($\omega_m$) Frequency Excitation Technique Since the variability in the single electrical frequency technique was eliminated by applying a mechanical excitation frequency, a simple and straightforward measurement of the true SoH of the battery is now possible. However, it should be understood that many different algorithms' and prediction models can be employed based on this disclosure. The underlying premise that makes these other modeling algorithms' and prediction methods deployable is that the application of mechanical excitation energy has provided additional information on the true electrochemical health of the electrochemical energy storage and/or energy conversion device. This measure is indicative of the battery's true electrochemical health and this will give the battery user reliable and unquestionable information about the battery's health, its age. The only change in the phase angle $\Delta\theta_e$ returned while the battery is under the influence of the proper mechanical excitation energy will be due to the battery components that are susceptible to aging phenomenon. As the battery ages these battery components will be less and less susceptible to the effects of the applied mechanical energy and the electrical phase change based on this mechanical excitation will become less and less prominent, i.e., $\Delta\theta_e(\omega_e)-\Delta\theta_e(\omega_m)\to 0$. Essentially, the green shaded area (above the horizontal axis) in FIG. 5 will get larger and larger as the battery undergoes aging phenomenon, with $\Delta\theta_e(\omega_m)\to\Delta\theta_e(\omega_e)$. The magnitude of this phase angle change $\Delta\theta_e(\omega_m)$, when mechanical excitation $(\omega_m)$ is applied, is dependent only on the contributions of the battery components, $R_{Paste}$, $R_{Sep}$, $R_{electrolyte}$, and $C_b$. As these components age, the mechanical energy $(\omega_m)$ will not have such a pronounced effect on their contributions to this electrical phase change $\Delta\theta_e(\omega_m)$, and this will be indication that the electrochemical health of the battery is declining. A measurement of the $\Delta\theta_e(\omega_m)$, while mechanical excitation $(\omega_m)$ is applied, will be the basis that all future measurements will be compared to. If at some future time in the battery's life, the measured $\Delta\theta_e(\omega_m)$, while mechanical excitation $(\omega_m)$ is applied, is less than that of the previous measurement, then this difference is due to battery aging only. Eventually, when the battery is heavily aged, or near end of life, the mechanical excitation energy will not change the electrical phase angle $\theta_e$, i.e., the difference between these two phase differences $\Delta\theta_e(\omega_e)-\Delta\theta_e(\omega_m)\to 0$, and the battery pack, and/or cell, should be replaced.

Since the aging effect of the battery components in question will gradually reduce their respective contributions to the battery's internal complex impedance response, and correspondingly change the measured phase angle $\theta_e$, one can take measurements at predetermined times, chart the progression in the phase angle change, and actually predict when the battery, and/or cell, will reach the end of its useful life. In fact, if one knows the actual SoH of the device under test one can apply a SoH factor to a known SoC and be able to determine the available capacity of that energy storage device and/or the conversion efficiency of an energy conversion device. It should also be understood that the variability introduced by the majority of the battery's components in the single electrical frequency technique can also still yield useful information on the overall health of the battery.

Several different and useful variations of this prediction model can be incorporated, and this will then aid the battery user in making decisions about their battery pack's health and when imminent replacement is necessary. Several phase angle $\theta_e(\omega_m)$ measurements, while mechanical excitation $(\omega_m)$ is applied, are taken and a projection of remaining battery life is determined. In one non-limiting embodiment of this disclosure, the age related contributions are projected using a straight-line approximation method and a prediction on remaining battery life is determined. Using various predictions algorithms and prediction techniques this method and device can also be used to accurately predict the device's residual energy capacity available for use as well as the device's remaining life time. While only the SoH determination method is described in this disclosure, it should be understood that the underlying premise of the measurement and prediction technique disclosed here is based on the availability of additional electrochemical health information that is made possible with the use of mechanical excitation energy with the current, and future, electrical excitation only measurement techniques, whether it be single frequency, dual, scanning, etc.

Figure 6:
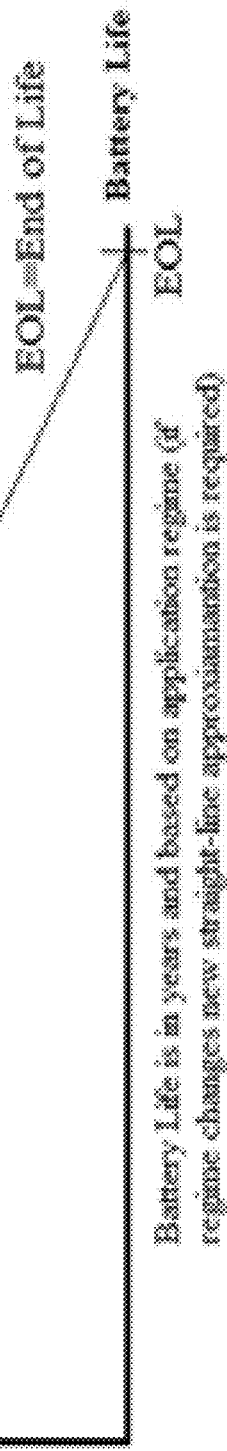
FIG. 6 is a graph illustrating in general terms, true state of health measurement in accordance with various embodiments of the invention based on voltage (V) versus current (I) phase differences using electrical and mechanical excitations.

As a non-limiting example, FIG. 6 is the straight-line approximation method for a typical battery. Let us say for illustrative, non-limiting numbers, that when a given battery is new, a battery is tested, and as a baseline, it is established that $\Delta\theta\equiv\Delta\theta_e(\omega_e)-\Delta\theta_e(\omega_m)=80°$. Over time as the battery ages, this 80° will diminish, which is to say, $\Delta\theta_e-\Delta\theta_e(\omega_m)$ will trend downward toward zero. As $\Delta\theta\equiv\Delta\theta_e(\omega_e)-\Delta\theta_e(\omega_m)\to 0°$, this means that the battery is approaching it end of life. While the actual state of health may not be perfectly linear as illustrated in FIG. 6, i.e., while a $\Delta\theta_e(\omega_e)-\Delta\theta_e(\omega_m)=40°$ reading which is halfway between 0° end of life and the 80° baseline may not mean that the battery is at exactly 50% of its useful life (i.e., while the straight, negatively-sloped line in FIG. 6 may not be exactly a line), one may use the linear scale in FIG. 6 as a good first order approximation of remaining battery life. FIG. 6 is analogous, then, to the indicator in an automobile which shows roughly the proportion of gasoline which remains in the tank. However, $\Delta\theta=\Delta\theta_e(\omega_e)-\Delta\theta_e(\omega_m)\to 0°$ is in all cases the measurement that indicates actual end of battery life, so the magnitude of $\Delta\theta_e(\omega_e)-\Delta\theta_e(\omega_m)$ in relation to a baseline-time phase difference (such as the 80° example above) may be taken as a rough linear gauge of battery SoH.

This real-time SoH value can be used to secure much more meaningful SoC measurements. There are intrinsic design flaws in the current SoC monitoring and charge control systems which are of critical importance to the overall energy storage management process. Battery manufacturers, integrators and users are making significant trade-offs, whether knowingly or unknowingly, between low-cost less-complicated monitoring and charging systems and battery capacity and power as well as overall service life. The industry's inability to develop solutions and technology platforms to solve these shortcomings is in a large part based on the inability to actually control the battery's electrical performance characteristics once it is put into service. Specifically, as taught in U.S. Pat. No. 7,592,094, and as supplemented in this disclosure, as the electrochemical storage device ages the available active material (energy capacity—A-hrs) decreases, and tertiary compounds crystallize and form unwanted bonds causing non-rechargeable masses to form on, around and within the electrodes, the charge acceptance declines, the cyclic efficiency falls off, the energy and power density declines, and eventually the battery cannot serve its intended function.

The prior art provides no direct way of measuring the SoC of a Li-Ion battery. There are indirect ways of estimating it, but each suffers from limitations which are overcome by using the real-time empirical SoH measurements as disclosed here. There are several methods, all of varying degrees of complexity and cost used in the art to better ascertain the remaining capacity of a battery (i.e. for battery monitoring). People are all familiar with laptop and cell phone battery indicators. When a user finds these to be running low (e.g. only one bar left, or, say 20% or less showing as a charge) we typical initiate a charge by plugging the device into a wall socket or a portable charger, no matter where we are or what time of the day it is. What may not be as familiar to most is the fact that as the battery (device) ages, users are forced to charge these devices much more frequently. In other words, a brand new portable battery-powered device may last a day or even a couple of days when it is first purchased, but as time goes on that same device may only last 4-8 hours the user must look for another wall AC outlet. Maybe not as obvious, one should notice that not only do users find themselves charging their phone more often; their charge times have also grown. Of course, this depends on how the device is used and all the power-hungry applications which may be used, but, the general decline in performance is common to all. Like taxes, this decline in performance, i.e. increase in the battery's internal impedance is inevitable, however, as previously discussed, U.S. Pat. No. 7,592,094 discloses a method and device that can essentially arrest this unwanted build-up of a battery's internal impedance.

SoC Monitoring with SoH Compensation—OCV and CCV Method

State-of-Charge (SoC) measurement based on Closed-Circuit Voltage (CCV) (i.e. also known as voltage translation) alone is not an effective method to determine residual capacity remaining in the battery. It may be somewhat effective for a brand-new battery under ideal conditions but the actual correspondence between CCV and SoC will diminish relatively shortly into its discharge cycle and shortly into the service life of the battery. For instance, if a Laptop reports that it's SoC is 90% and that it has 2 hours and 10 minutes of remaining life this may be close to the true since it is nearly fully charged, and if the Laptop or its battery is relatively new. More than likely, at the 1 hour point later (and assuming computer usage was not altered), the computer may report that you only have 30 minutes life remaining. One may ask where 40 minutes of runtime was lost. The average Laptop user likely does not pay this level of attention or has already lost trust in their Laptop's SoC or remaining runtime measure, and this is likely why the first thing users are always doing is looking for an AC wall outlet. For the users that may notice this inconsistency and inaccuracy they likely blame this on their computer usage and how many power-hungry applications they had launched. Regardless, this method may suffice for a Laptop or cell phone because we are always able to plug it in and recharge, however, in many other and larger applications we do not have this option.

Unfortunately, one can only get a useful SoC measure if an Open-Circuit Voltage (OCV) is measured after the battery has been rested for a lengthy period of time. Also, based on the constant increase and change in the battery's internal impedance over service life the accuracy of the monitoring system is further compromised. It is clear that this OCV technique will not be useful if the user needs to know how much energy remains in their battery pack immediately, i.e. for an EV fuel gauge, a portable medical device, and emergency backup power supply, etc.

By applying using the type of empirical, real-time SoH earlier disclosed here, the measured CCV may be compensated with a correction to significantly improve on the accuracy of this CCV and its correlation to SoC. Such an approach that take the empirical SoH as an input to the SoC determination will allow manufacturers to keep a majority of their current SoC measurement systems hardware intact and give them the ability to compensate and adjust the information currently reported by their devices via the modifications of their software algorithms. This added manufacturer functionality and flexibility will give the users a much more accurate estimate of the residual capacity remaining in the battery (i.e. SoC), especially, after the battery has aged.

SoC Monitoring with SoH Compensation—Coulomb Counting Method

Another method used in the art to determine SoC for many Li-ion portable devices is the use Coulomb counting. This method works by measuring the current that flows in (i.e. energy in) and out (i.e. energy out) of the battery. However, impedance losses during the charge and discharge process and other inefficiencies reduce the total energy actually delivered and returned from the energy storage device and diminish the effectiveness of this SoC method. If the initial SoC of the battery is known, from there the Coulomb counting technique can be used to calculate its future SoC. If not, that presents a problem. For example, a 3 A current into a battery, for 2 hours, will add 3*2=6 Ah to the battery charge. If the battery capacity is 24 Ah, that will increase its SoC by 6/24=25%. That's 25% more than it had been at the beginning. But without knowing what the beginning SoC was, one does not know the final SoC. Using the CCV, if one could count on it, would be one way to determine the initial SoC, however, the prior art presents no good way to do this.

Notwithstanding these Coulomb counting inefficiencies, this method is widely used for portable Li-ion applications. Unfortunately, when it comes to other chemistries, such as lead acid, where the charge and discharge losses are greater and when dealing with larger Li-ion applications (e.g. HeV, PHeV, EV, frequency regulation, etc.) this method alone is not adequate. Device manufacturers advertise a +/−1% accuracy, however, this is only possible with a brand new battery, under ideal conditions, and very early into the discharge and service life of battery. This measurement accuracy is impacted by many factors such as aging, but it is also impacted by drift issues. In Coulomb counting the current is typically integrated to determine total charge transfer, and as with any integration it is susceptible to drift. Independent tests show large errors using this technique in typical use and as the battery applications become more demanding, for example, with more frequent charge and discharge, faster and more rapid transients, larger amplitudes, etc., the errors will be even greater.

Aging and the build-up of internal impedance causes a steady decline in this Coulomb counting SoC measurement technique. By factoring in an empirical, real time SoH determined as disclosed earlier to compensate the measured Coulomb counting method output will significantly improve the accuracy of this measurement. It will allow manufacturers to keep their current SoC measurement systems hardware intact and give them the ability to compensate and adjust the information currently reported by their devices via the current software algorithms. This added manufacturer functionality and flexibility will give the users a much more accurate estimate of the residual capacity remaining in the battery (i.e. SoC), especially, after the battery has aged.

Regardless of the current SoC measurement method being used, or the battery chemistry it is applied to, if the system does not account for the effects that cycle aging have on the battery's electrical performance characteristics, it will benefit from this disclosed methodology.

Figure 10:
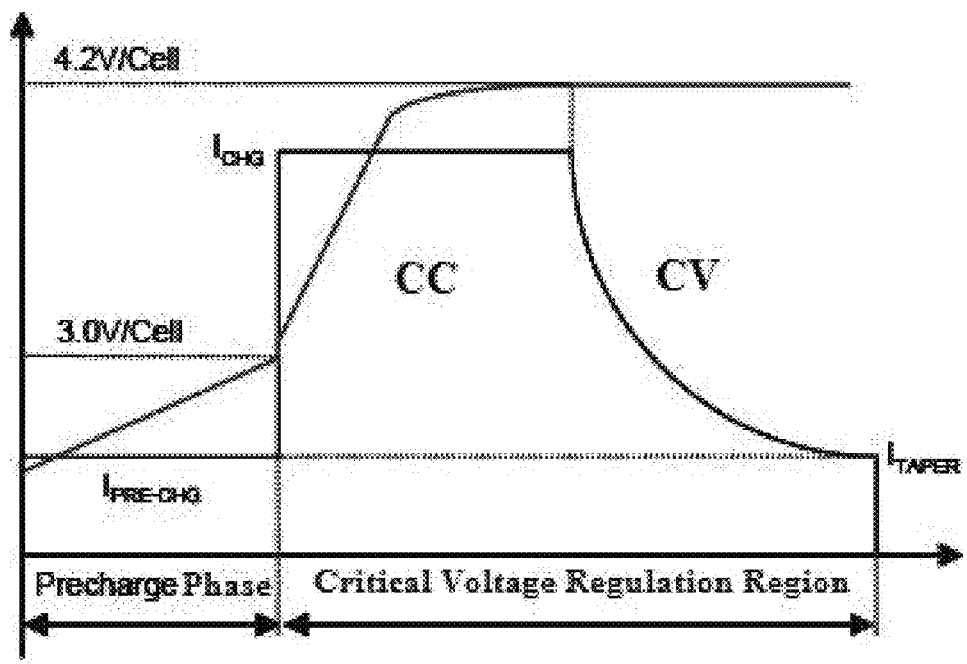
FIG. 10 is a graph of the three charge phase a typical Li-ion battery during charging.

Charging & Voltage Regulation Accuracy with SoH Compensation Vs. Capacity Fade and Service Life In this discussion, we use a typical Li-ion battery for illustrative purposes; however, this in no way limits this approach with respect to other battery chemistries or in general with electrochemical conversion devices. As shown in FIG. 10, the charging of a Li-Ion battery generally consists of three phases: pre-charge; fast-charge constant current (CC); and constant voltage (CV) termination (i.e. $I_{Taper}$). In the pre-charge phase, the battery is charged at a low-rate (typical of ⅒ the fast charge rate) when the battery cell voltage is below 3.0 V. Above 3.0 V the battery is charged at a higher and constant rate (i.e. CC) until it reaches voltage plateau (typically 4.2V for Li-ion). Finally, it enters the CV phase where the charge current exponentially drops to a defined termination level. The CC and CV phase are controlled via the measured CCV and voltage regulation is of critical importance.

Many Integrated Circuit (IC) manufacturers are responding to the market need for more accurate and safer battery chargers by developing low-cost linear battery chargers. A low-cost standalone linear battery IC only uses a few external components, hence the low cost; however, they also come with inherent and significant disadvantages. These low-cost IC's, with less than adequate voltage regulation accuracy, come with a penalty. The trade-off is a lower initial charger system cost vs. a lower battery capacity and service life. Specifically, the higher the capacity and power fade means the manufacturer must pay a higher initial cost in A-Hr capacity to ensure operation (i.e. buy a larger battery than needed) and the shorter service life results in a higher cost to the user in replacement cost. Thus, the manufacturers' attempt to reduce the initial cost of the battery charging system, although admirable if this savings is passed to the customer, is actually resulting in an overall total cost of ownership penalty.

Figure 7:
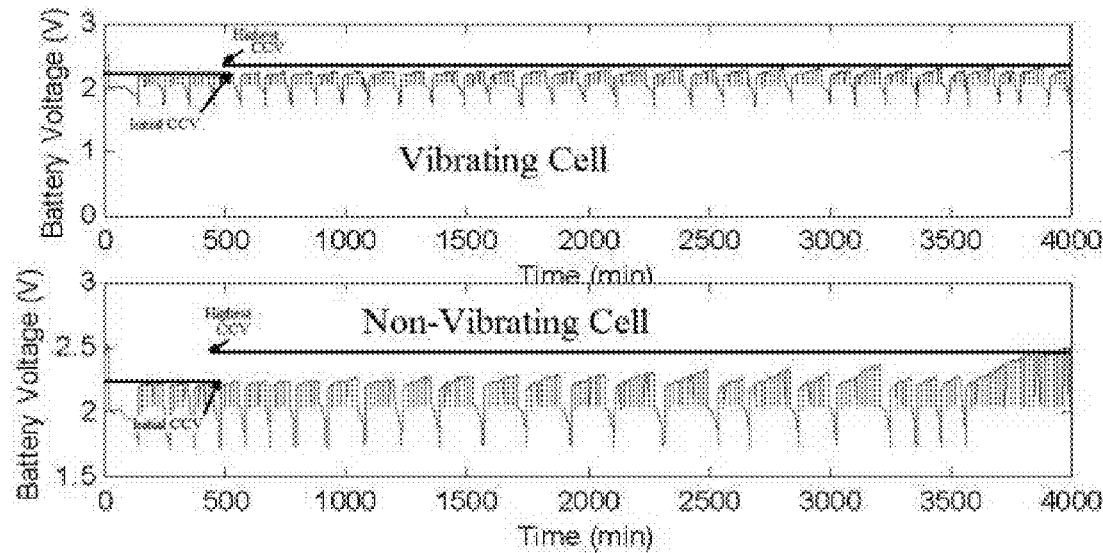
FIG. 7 is graph illustrating the cycle testing of a commercially available vented lead acid battery with and without mechanical excitations applied.
Figure 8:
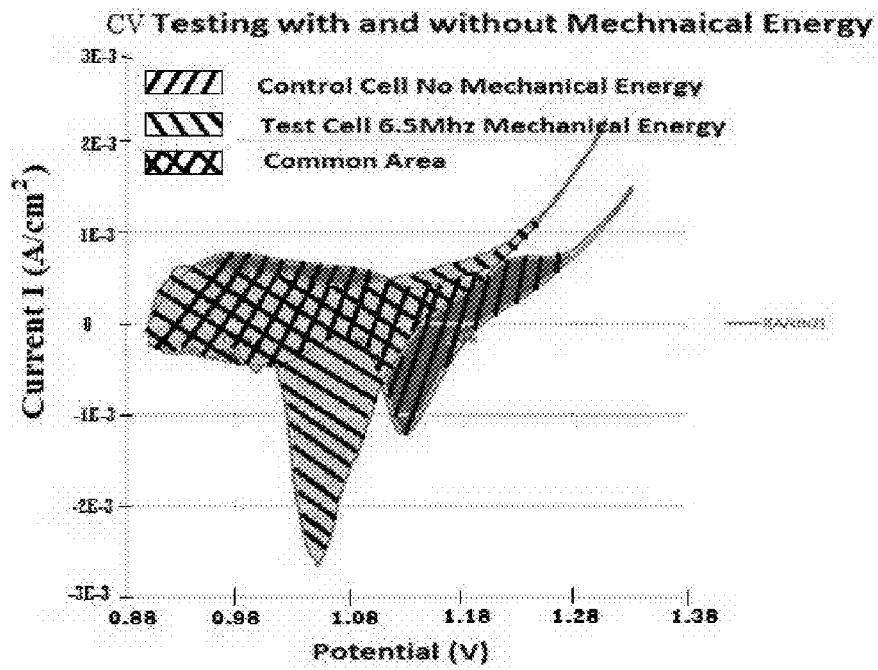
FIG. 8 is a Cyclic-Voltammetry (CV) test which compares battery cell Current (I) response to an applied Voltage (V). The test specimen is a 1 $cm^2$ area of a porous lead (Pb) electrode, submerged in sulfuric acid at a 1.31 specific gravity at 80° F. with and without mechanical excitation applied and at the exact same scan rate.
Figure 9:
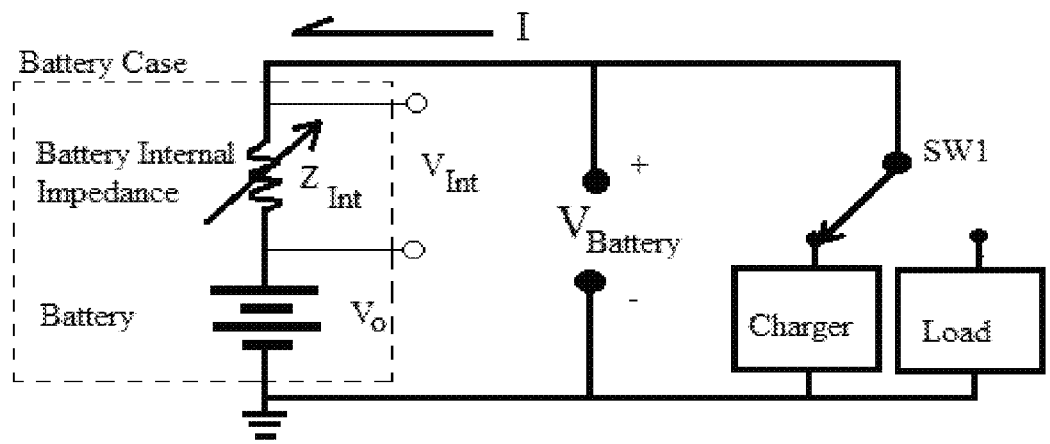
FIG. 9 is a schematic of a simple charge and discharge circuit which models the time-variable impedance of a batter due to degradation.

Specifically, during the CC and CV phase, accurate voltage regulation is critical to ensure optimum battery capacity and power utilization and improved service life. Less accurate battery voltage regulation (i.e. wider tolerance) can result in undercharging the battery pack, which results in a large decrease in battery capacity and power (increased capacity and power fade) earlier and throughout service life. For example, the battery loses about 8% eight percent capacity (about 120 mAH for a 1500 mAH battery) if it is undercharged by 1% voltage (about +/−0.037V for a typically 3.7V battery). For example, if the CCV voltage triggered the CV phase at ~4V (−5% regulation), that battery would be undercharged and there would be less energy available during its discharge (i.e. capacity fade). On the other hand, inaccurate battery voltage regulation also means the battery pack and/or cells can be overcharged, and it is well known that overcharging can significantly reduce the battery service life and also raise considerable safety and reliability concerns. Voltage regulation is of the utmost importance; however, there is also another effect that further complicates these negative effects. Based on the battery industry's frustration and inability to solve Li-ion chemistries pronounced capacity fade and shorter-than-desired service lives this is likely the predominant factor and the problem that needs to be solved. Based on this disclosure and that of U.S. Pat. No. 7,592,094, over the service life of a battery the internal impedance ($Z_{Int}$) of a battery increases (i.e. FIGS. 7, 8 and 9). Therefore, at the same rated charge current (i.e. pre-charge and CC phase C-rate) the measured CCV voltage will reach the CV plateau sooner into the charge and trigger the CV phase. However, if the charge controller manufacturer assumes that this internal impedance ($Z_{Int}$) does not impact the measured CCV in a way that compromises the designed correlation between CCV and SoC, then voltage regulation accuracy itself becomes of secondary concern. Meaning, since the measured CCV reaches the CV threshold voltage (e.g., 4.2V) earlier in the high-rate constant current (CC) charge it will be present for a shorter period of time which will result in less electrical energy being converted to chemical potential energy (i.e. recharge), thus it will enter the CV phase at a lower SoC. At the same constant charge voltage (i.e. CV phase ~4.2V), the current available for conversion to chemical potential energy will be less because of this same increase in $Z_{Int}$ and therefore for the same time to termination the conversion of electrical energy to chemical potential energy will be less and less (i.e. lower SoC). So, the designer may select ~4.2V as a threshold of CV phase based on the understanding that this correlates to a specific SoC level for this Li-ion chemistry, however, as the battery ages this correlation diminishes.

As the service life of the battery increases this effect will become more and more pronounced and become the majority contributor to dramatic capacity and power fade as well as accelerated degradation and premature failure of the battery pack. Additionally, this effect is further compounded earlier into its service life as the duty cycle of the battery pack becomes more demanding (i.e. more frequent charge and discharge, faster and more rapid transients, larger amplitudes, etc.).

In order to reduce this under and over-charging issue that plagues the industry, the measured CCV that the charging system regulates to must be accurate and even more importantly must be representative of the actual empirical, real-time capacity available (i.e. SoC) at that point in the battery's service life. This disclosure teaches away from measured voltage regulation as being the major contributor to capacity and power fade and a subsequent decline in service life. It teaches that in addition to accurate voltage regulation one must account for the empirically and accurately-measured SoH conditions of the battery. It also teaches that even though voltage regulation accuracy is critical to battery performance and service life, degradation (i.e. a.k.a. aging, build-up of internal impedance) is also critical and the predominant factor that must be accounted for as the battery ages. Additionally, as the battery's service becomes more demanding (i.e. more frequent charge and discharge, faster and more rapid transients, larger amplitudes, etc.) this negative effect is amplified and more pronounced which leads to larger capacity and power fade as well as accelerated degradation and premature failure.

A simple but descriptive analogy to this issue: Take a much older vehicle gas tank where sediment will collect at the bottom of the tank, corrosion layers will build up on the walls of the tank and where the water content increases over time. So, when the car is new one may get 400 miles per tank but a few years later that same tank fill up (equivalent gallons) will only yield 350 miles. The corollary to the SoC problem above is that the car's fuel gauge (i.e. CCV–SoC) reports 'Full' in both cases. Of course, newer and more ideal gas tanks are not as susceptible to these issues since over the years solutions have been developed and implemented to minimize this effect. This empirical, real-time SoH compensation can be related to the gas tank solutions, but for the battery.

There are battery chargers on the market today that are much more accurate; however they are also much more complicated and expensive. For example, there are battery chargers that not only monitor voltage but also monitor temperature and current which may allow for a compensation of the battery's actual internal impedance effect, and there are also chargers that predict the battery's degradation and compensates for it. There are also elaborate and complex systems and algorithms that predict battery capacity based on an assumed theoretical operational profile, however, if the in service battery deviates from the theoretical norm these elaborate systems fall apart. These charging systems are overly complicated and expensive especially for smaller portable applications. This is likely the basis for manufactures moving towards these low-cost IC's and this negative trend of regulating based only on measured CCV (i.e. $V_{Battery}$) without taking into account the as-is empirically-deduced capacity (i.e. SoH factored into the SoC). This ultimately leads to less-than-desirable battery performance and service life. Utilizing the disclosed SoH monitoring technique will allow for real-time correction of the measured CCV to account for degradation or aging of the battery cells that make up the battery pack. The low-cost linear IC charger discussed above do not take this variance into account and therefore sacrifices available battery capacity and service life of the battery pack, which is accentuated as the battery pack's duty cycle becomes more demanding (i.e. rapid, fast transients, high amplitudes, more frequent charging, etc.). This same methodology can and should be applied during the formation charging process to account for and minimize the negative effect that inaccurate voltage regulation has on the 'as-built' condition of the battery cell. During formation charging, the voltage profile is extremely important and can affect the battery's ultimate performance and lifetime characteristics.

The disclosures here can be applied to any electrochemical energy storage and/or energy conversion devices (generally referred to simple as "energy devices"), including but not limited to, certain types of fuel cells, solar cells and capacitor technologies. In the broad understanding of the method and device disclosed here, it applies to any electrochemical energy device in which there are ionic species kinetic limitations and/or deficiencies. Certain fuel cells, solar cells and capacitors also have known ionic kinetic deficiencies which impact their operating characteristics and performance and it should be understood that this method and device disclosed encompasses these type of devices as well.

It is to be understood that once SoH has been empirically determined for a battery at any given real time, the process of then deducing the SoC will typically entail using a computerized device such as but not limited to an integrated circuit with suitable processing capacity and non-transitory storage, and that the SoH determination will be used in lieu of, or as a supplement to, other known methods which are used to deduce SoC from an assumed—though not empirically-established—SoH, or, in some cases, from making no supposition at all about the SoH. It is also understood that the raw SoH data may be transformed by the computerized device and presented to the user in the form of a user-friendly data display such as but not limited to a percentage number representing how charged the battery is in relation to its total charge capacity. It is also understood that an empirically-deduced SoC in real time may then be applied via the same or additional computerized device as part of the input data used for to control and optimize the charging and/or discharging of the battery so as to maximize its capacity, its energy delivery, and its service life, and to minimize its recharging time.

The knowledge possessed by someone of ordinary skill in the art at the time of this disclosure is understood to be part and parcel of this disclosure and is implicitly incorporated by reference herein, even if in the interest of economy express statements about the specific knowledge understood to be possessed by someone of ordinary skill are omitted from this disclosure. While reference may be made in this disclosure to the invention comprising a combination of a plurality of elements, it is also understood that this invention is regarded to comprise combinations which omit or exclude one or more of such elements, even if this omission or exclusion of an element or elements is not expressly stated herein, unless it is expressly stated herein that an element is essential to applicant's combination and cannot be omitted. It is further understood that the related prior art may include elements from which this invention may be distinguished by negative claim limitations, even without any express statement of such negative limitations herein. It is to be understood, between the positive statements of applicant's invention expressly stated herein, and the prior art and knowledge of the prior art by those of ordinary skill which is incorporated herein even if not expressly reproduced here for reasons of economy, that any and all such negative claim limitations supported by the prior art are also considered to be within the scope of this disclosure and its associated claims, even absent any express statement herein about any particular negative claim limitations.

Finally, while only certain preferred features of the invention have been illustrated and described, many modifications, changes and substitutions will occur to those skilled in the art. It is, therefore, to be understood that the appended claims are intended to cover all such modifications and changes as fall within the true spirit of the invention.

I claim:

1. A method for empirically determining the state-of-charge of an electrochemical energy device, comprising:
   applying electrical excitations to the energy device at a predetermined electrical excitation frequency $\omega_e$;
   applying mechanical excitations to the energy device at a predetermined mechanical excitation frequency $\omega_m$;
   measuring an electrically-induced phase difference $\Delta\theta_e(\omega_e)$ between voltage (V) and current (I) within the energy device from applying said electrical excitations;
   measuring a mechanically-induced phase difference $\Delta\theta_e(\omega_m)$ between voltage (V) and current (I) within the energy device from applying said mechanical excitations; and
   deducing the empirical real-time state-of-health of said energy device by comparing said electrically-induced phase difference $\Delta\theta_e(\omega_e)$ with said mechanically-induced phase difference $\Delta\theta_e(\omega_m)$; and
   using said deduced state of health to determine the state of charge.

2. The method of claim 1, further comprising:
   taking a difference $\Delta\theta=\Delta\theta_e(\omega_e)-\Delta\theta_e(\omega_m)$ between said electrically-induced phase difference $\Delta\theta_e$ and said mechanically-induced phase difference $\Delta\theta_e(\omega_m)$; and
   using said difference as a basis to deduce said SoH.

3. The method of claim 2, further comprising:
   deducing the state-of-health of said energy device by determining a magnitude of $\Delta\theta=\Delta\theta_e(\omega_e)-\Delta\theta_e(\omega_m)$ in relation to 0°, wherein better state-of-health is deduced from said magnitudes being larger and poorer state-of-health is deduced from said magnitudes being smaller.

4. The method of claim 2, further comprising:
   deducing that said energy device is approaching its end of life by determining that $\Delta\theta=\Delta\theta_e(\omega_e)-\Delta\theta_e(\omega_m)\to 0°$.

5. The method of claim 1, further comprising:
   at a baseline time, determining baseline-time phase differences $\Delta\theta_e(\omega_e)$ and $\Delta\theta_e(\omega_m)$ between current and voltage of said energy device;
   at a later time, determining later-time phase differences $\Delta\theta_e(\omega_e)$ and $\Delta\theta_e(\omega_m)$ between current and voltage of said energy device; and
   deducing said state of health by comparing said later-time phase difference with said baseline-time phase difference.

6. The method of claim 5, further comprising:
   deducing said state of health by determining how much said later-time phase difference has diminished from said baseline time phase difference.

7. The method of claim 6, further comprising deducing a magnitude of decline in said state of health substantially in proportion to said diminution.

8. The method of claim 1, wherein:
   a difference between measurements of internal impedance $Z_{INT}$ the energy device when said electrical excitation frequency $\omega_e$ is applied versus when said mechanical excitation frequency $\omega_m$ is applied, is determined according to:

$$Z_{INT}^e(\omega_e) - Z_{INT}^e(\omega_m) =$$

$$\begin{pmatrix} \dfrac{\dfrac{1}{R_{el}(\omega_e)}}{\dfrac{1}{R_{el}^2(\omega_e)} + (\omega_e C_b(\omega_e))^2} - \\ \dfrac{\dfrac{1}{R_{el}(\omega_m)}}{\dfrac{1}{R_{el}^2(\omega_m)} + (\omega_e C_b(\omega_m))^2} \end{pmatrix} - j \begin{pmatrix} \dfrac{\omega_e C_b(\omega_e)}{\dfrac{1}{R_{el}^2(\omega_e)} + (\omega_e C_b(\omega_e))^2} - \\ \dfrac{\omega_e C_b(\omega_m)}{\dfrac{1}{R_{el}^2(\omega_m)} + (\omega_e C_b(\omega_m))^2} \end{pmatrix},$$

where $R_{el}$ designates an electrochemical resistance of said energy device and $c_b$ designates a storage capacity of said energy device; further comprising:

deducing said electrically-induced phase difference $\Delta\theta_e(\omega_e)$ between said voltage V and said current I according to $$Z_{INT}^e(\omega_e) = \frac{V\sqrt{\theta_e(\omega_e)}}{I};$$

and deducing said mechanically-induced phase difference $\Delta\theta_e(\omega_m)$ between said voltage V and said current I according to $$Z_{INT}^e(\omega_m) = \frac{V\sqrt{\theta_e(\omega_m)}}{I}.$$

9. The method of claim 1, further comprising using said state of charge determination to display to a user the degree to which said electrochemical energy device is presently charged.

10. The method of claim 1, further comprising using said state of charge determination to control and optimize the charging and/or discharging of said electrochemical energy device.

11. An apparatus for empirically determining the state-of-charge of an electrochemical energy device, comprising:

an electrical excitation source for applying electrical excitations to the energy device at a predetermined electrical excitation frequency $\omega_e$;

a mechanical excitation source for applying mechanical excitations to the energy device at a predetermined mechanical excitation frequency $\omega_m$;

a measurement device for measuring an electrically-induced phase difference $\Delta\theta_e(\omega_e)$ between voltage (V) and current (I) within the energy device from applying said electrical excitations; and said measurement device for further measuring a mechanically-induced phase difference $\Delta\theta_e(\omega_m)$ between voltage (V) and current (I) within the energy device from applying said mechanical excitations; wherein the empirical real-time state-of-health of said energy device is deduced by comparing said electrically-induced phase difference $\Delta\theta_e(\omega_e)$ with said mechanically-induced phase difference $\Delta\theta_e(\omega_m)$; and said deduced state of health is used to determine the state of charge.

12. The apparatus of claim 11, wherein:

the state-of-health of said energy device is deduced by taking a difference $\Delta\theta = \Delta\theta_e(\omega_e) - \Delta\theta_e(\omega_m)$ between said electrically-induced phase difference $\Delta\theta_e$ and said mechanically-induced phase difference $\Delta\theta_e(\omega_m)$.

13. The apparatus of claim 12, wherein:

the state-of-health of said energy device is deduced by determining a magnitude of $\Delta\theta = \Delta\theta_e(\omega_e) - \Delta\theta_e(\omega_e)$ in relation to $0°$, and wherein better state-of-health is deduced from said magnitudes being larger and poorer state-of-health is deduced from said magnitudes being smaller.

14. The apparatus of claim 12, wherein:

said energy device is approaching its end of life is deduced by determining that $\Delta\theta = \Delta\theta_e(\psi_e) - \Delta\theta_e(\psi_m) \to 0°$.

15. The apparatus of claim 11, wherein:

baseline-time phase differences $\Delta\theta_e(\omega_e)$ and $\Delta\theta_e(\omega_m)$ between current and voltage of said energy device are determined at a baseline time;

later-time phase differences $\Delta\theta_e(\omega_e)$ and $\Delta\theta_e(\omega_m)$ between current and voltage of said energy device are determined at a later time;

said baseline-time phase difference is compared with said later-time phase difference to deduce said state-of-health.

16. The apparatus of claim 15, wherein:

said state of health is deduced by determining how much said later-time phase difference has diminished from said baseline time phase difference.

17. The apparatus of claim 16, wherein a magnitude of decline in said state of health is deduced substantially in proportion to said diminution.

18. The apparatus of claim 11, wherein:

a difference between measurements by said measurement device of internal impedance $Z_{INT}$ the energy device when said electrical excitation frequency $\omega_e$ is applied versus when said mechanical excitation frequency $\omega_m$ is applied, is determined according to:

$$Z_{INT}^e(\omega_e) - Z_{INT}^e(\omega_m) =$$

$$\begin{pmatrix} \dfrac{\dfrac{1}{R_{el}(\omega_e)}}{\dfrac{1}{R_{el}^2(\omega_e)} + (\omega_e C_b(\omega_e))^2} - \\ \dfrac{\dfrac{1}{R_{el}(\omega_m)}}{\dfrac{1}{R_{el}^2(\omega_m)} + (\omega_e C_b(\omega_m))^2} \end{pmatrix} - j \begin{pmatrix} \dfrac{\omega_e C_b(\omega_e)}{\dfrac{1}{R_{el}^2(\omega_e)}(\omega_e C_b(\omega_e))^2} - \\ \dfrac{\omega_e C_b(\omega_m)}{\dfrac{1}{R_{el}^2(\omega_m)} + (\omega_e C_b(\omega_m))^2} \end{pmatrix},$$

where $R_{el}$ designates an electrochemical resistance of said energy device and $c_b$ designates a storage capacity of said energy device;

said electrically-induced phase difference $\Delta\theta_e(\omega_e)$ between said voltage V and said current I is deduced according to $$Z_{INT}^e(\omega_e) = \frac{V\sqrt{\theta_e(\omega_e)}}{I};$$

and
said mechanically-induced phase difference $\Delta\theta_e(\omega_m)$ between said voltage V and said current I is deduced according to $$Z^e_{INT}(\omega_m) = \frac{V\sqrt{\theta_e(\omega_m)}}{I}.$$

19. The apparatus of claim 11, wherein said state of charge determination is used to display to a user the degree to which said electrochemical energy device is presently charged.

20. The apparatus of claim 11, wherein said state of charge determination is used to control and optimize the charging and/or discharging of said electrochemical energy device.

\* \* \* \* \*